United States Patent
Le et al.

(10) Patent No.: US 7,154,257 B2
(45) Date of Patent: Dec. 26, 2006

(54) UNIVERSAL AUTOMATED CIRCUIT BOARD TESTER

(75) Inventors: Chanh Le, Beaverton, OR (US); Say Cheong Gan, Melaka (MY); Thomas A. Repko, Dallas, OR (US); Frank W. Joyce, Portland, OR (US); Teik Sean Toh, Sungai Petani (MY); Douglas P. Kreager, Lake Oswego, OR (US); Yoong Li Liew, Kulim (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/261,055

(22) Filed: Sep. 30, 2002

(65) Prior Publication Data

US 2004/0064288 A1 Apr. 1, 2004

(51) Int. Cl.
*G01R 31/28* (2006.01)
(52) U.S. Cl. .................................. 324/158.1
(58) Field of Classification Search ............... 324/765, 324/754, 534, 158.1, 755, 761, 72.5, 769, 324/725.5, 760, 763; 714/719, 720, 724; 702/120
See application file for complete search history.

(56) References Cited

U.S. PATENT DOCUMENTS

| | | | |
|---|---|---|---|
| 3,924,109 A | 12/1975 | Jhu et al. | |
| 4,513,498 A | 4/1985 | Kent | |
| 4,517,512 A | 5/1985 | Petrich et al. | |
| 4,550,406 A | 10/1985 | Neal | |
| 4,574,235 A | 3/1986 | Kelly et al. | |
| 5,124,636 A | 6/1992 | Pincus et al. | |
| 5,541,504 A * | 7/1996 | Kubo et al. ............... | 324/158.1 |
| 5,609,489 A | 3/1997 | Bickford et al. | |
| 5,751,151 A | 5/1998 | Levy et al. | |
| 6,084,774 A | 7/2000 | Talbot et al. | |
| 6,087,839 A * | 7/2000 | Choi ........................... | 324/754 |
| 6,097,202 A * | 8/2000 | Takahashi .................... | 324/761 |
| 6,100,706 A | 8/2000 | Hamilton et al. | |
| 6,118,288 A * | 9/2000 | Kang .......................... | 324/754 |
| 6,163,866 A | 12/2000 | Ansari | |
| 6,344,736 B1 * | 2/2002 | Kerrigan et al. ......... | 324/158.1 |
| 6,422,886 B1 | 7/2002 | Macbeth et al. | |
| 6,453,435 B1 | 9/2002 | Limon, Jr. et al. | |
| 6,459,805 B1 | 10/2002 | Reynolds et al. | |
| 6,462,570 B1 * | 10/2002 | Price et al. .................. | 324/754 |

(Continued)

FOREIGN PATENT DOCUMENTS

DE 3405568 8/1985

(Continued)

*Primary Examiner*—Ha Tran Nguyen
*Assistant Examiner*—Tung X. Nguyen
(74) *Attorney, Agent, or Firm*—Blakely, Sokoloff, Taylor & Zafman LLP

(57) ABSTRACT

An apparatus and method for automatically testing circuit boards, such as computer system boards and the like. The circuit board device under test (DUT) is loaded into an automated test apparatus (tester), which includes a mechanism for automatically connecting test electronics to various DUT circuitry and I/O ports via corresponding connectors on the DUT. A type of DUT is identified, and a corresponding set of tests are performed to verify the operation of the DUT. Appropriate power signals and sequencing are also applied to the DUT, as defined by it type. Data logging is performed to log the results of the testing. The apparatus includes replaceable probe/connector plates that are DUT-type specific and corresponding universal electronics and cabling to enable a variety of different board types to be tested with the same apparatus.

20 Claims, 24 Drawing Sheets

U.S. PATENT DOCUMENTS

| | | |
|---|---|---|
| 6,524,123 B1 | 2/2003 | Kedrowski et al. |
| 6,532,558 B1 | 3/2003 | Allen et al. |
| 6,597,189 B1 | 7/2003 | Grilletto |
| 6,630,832 B1 * | 10/2003 | Harzanu et al. ............ 324/537 |
| 6,744,268 B1 | 6/2004 | Hollman |
| 6,754,763 B1 | 6/2004 | Lin |
| 6,757,715 B1 | 6/2004 | Philyaw |
| 2004/0043653 A1 | 3/2004 | Feldman |
| 2004/0064273 A1 | 4/2004 | Le at al. |
| 2004/0066207 A1 | 4/2004 | Bottoms et al. |
| 2004/0263188 A1 | 12/2004 | Hwang |

FOREIGN PATENT DOCUMENTS

| | | |
|---|---|---|
| DE | 4100014 A1 | 7/1992 |
| EP | 0293304 | 11/1988 |
| FR | 2224972 | 10/1974 |
| WO | WO 98/25152 | 6/1998 |
| WO | PCT/US2004/005938 | 9/2004 |

* cited by examiner

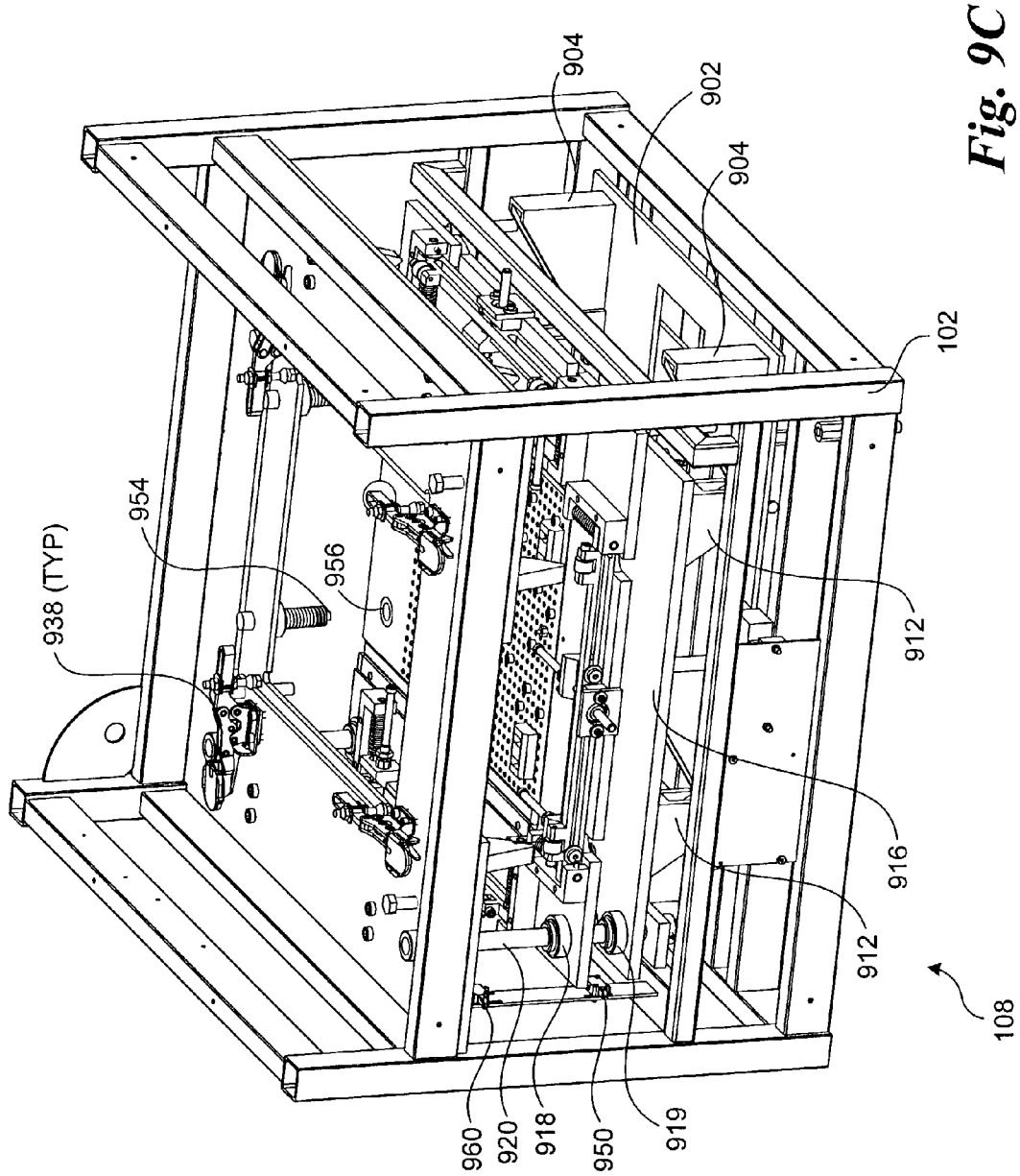

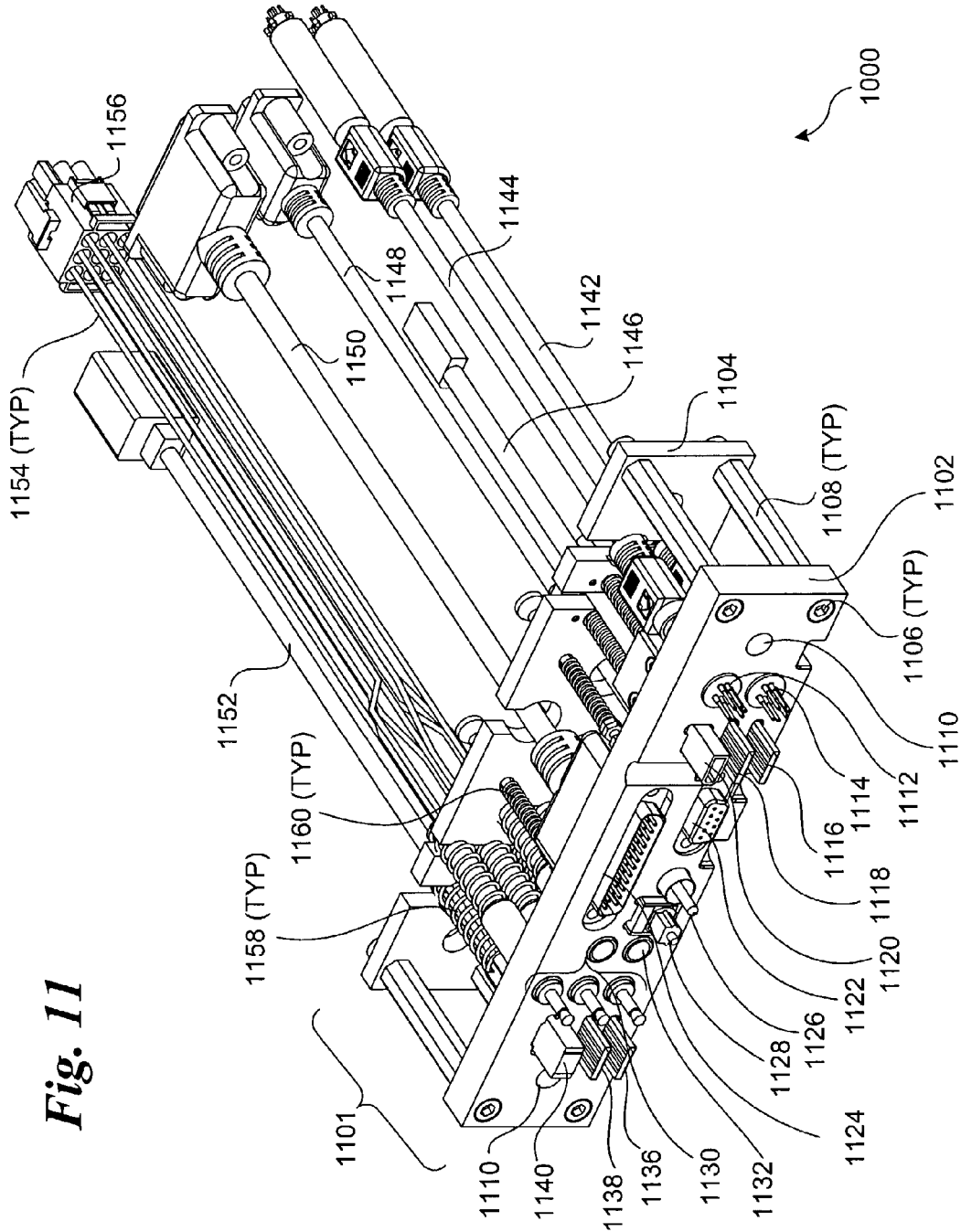

UNIVERSAL AUTOMATED CIRCUIT BOARD TESTER

CROSS-REFERENCE TO RELATED APPLICATIONS

The present application contains subject matter related to concurrently filed U.S. application Ser. No. 10/261,118, filed Sep. 30, 2002, entitled "USB-CONTROLLABLE POWER SUPPLY."

FIELD OF THE INVENTION

The field of invention relates generally to computer systems and, more specifically but not exclusively relates to an apparatus and method for automatically testing circuit boards used in computer systems.

BACKGROUND INFORMATION

It is a common practice to perform testing of circuit boards, such as computer system boards (i.e., motherboards and the like) prior to their sale or use in a computer system product. For example, as computer system boards have evolved, an ever-increasing level of functionality has been built into the boards, such as integrated video subsystems, audio systems, network interfaces, modem circuitry, and the like. Testing to verify the integrity of such functionality is often performed during quality control operations, either on an individual board basis, or using a random sampling scheme.

Generally, computer system boards are tested in the following manner. The board is mounted or otherwise coupled to a test plate or the like, and a plurality of input connectors are manually mated with corresponding system board connectors to provide input power signals to the system board and to coupled input/output (I/O) ports and the like to electronic test equipment that is used to test the performance of the system board via a variety of test operations. Additional manual operations typically include insertion of memory and/or microprocessors. This is a very laborious process, and is also very time-consuming. As a result, the test throughput is low, and test costs are excessive.

In addition, when different types of computer system boards are to be tested, the test environment will often require a uniquely-configured test station for each type of board. For example, different system board types may require different power supply inputs, and/or may have different memory slot locations. Accordingly, the test station used to perform testing of such system boards must be configured to accommodate any unique characteristics of the system boards. This adds to the expense and complexity of a test environment. Furthermore, when the computer system board for a particular test station is phased out of production, the test station is often scrapped, as it cannot be used to test other types of system boards.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein like reference numerals refer to like parts throughout the various views unless otherwise specified:

FIGS. 9A, 9B, and 9C respectively show exploded, frontal, and side isometric views of the automated probe/connector insertion mechanism employed an embodiment of the invention;

FIG. 11 is an isometric view of a Side Access Unit (SAU); and

DETAILED DESCRIPTION OF PREFERRED EMBODIMENTS

Embodiments of a system, apparatus and method and for performing automated testing of circuit boards, such as computer system boards and the like are described herein. In the following description, numerous specific details are set forth to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1A:
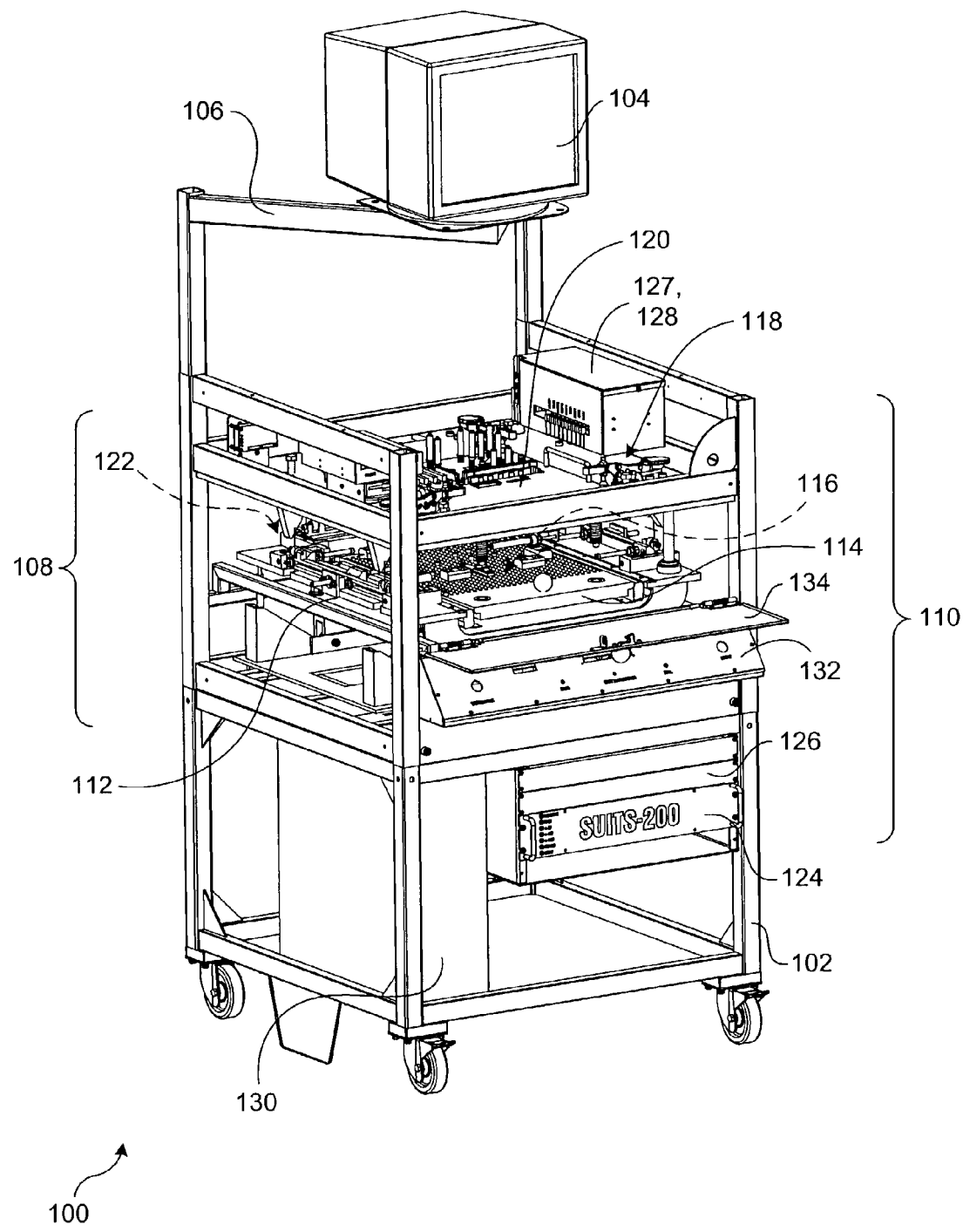
FIGS. 1A and 1B are isometric views of an automated universal circuit board tester in accordance with one embodiment of the invention.
Figure 1B:
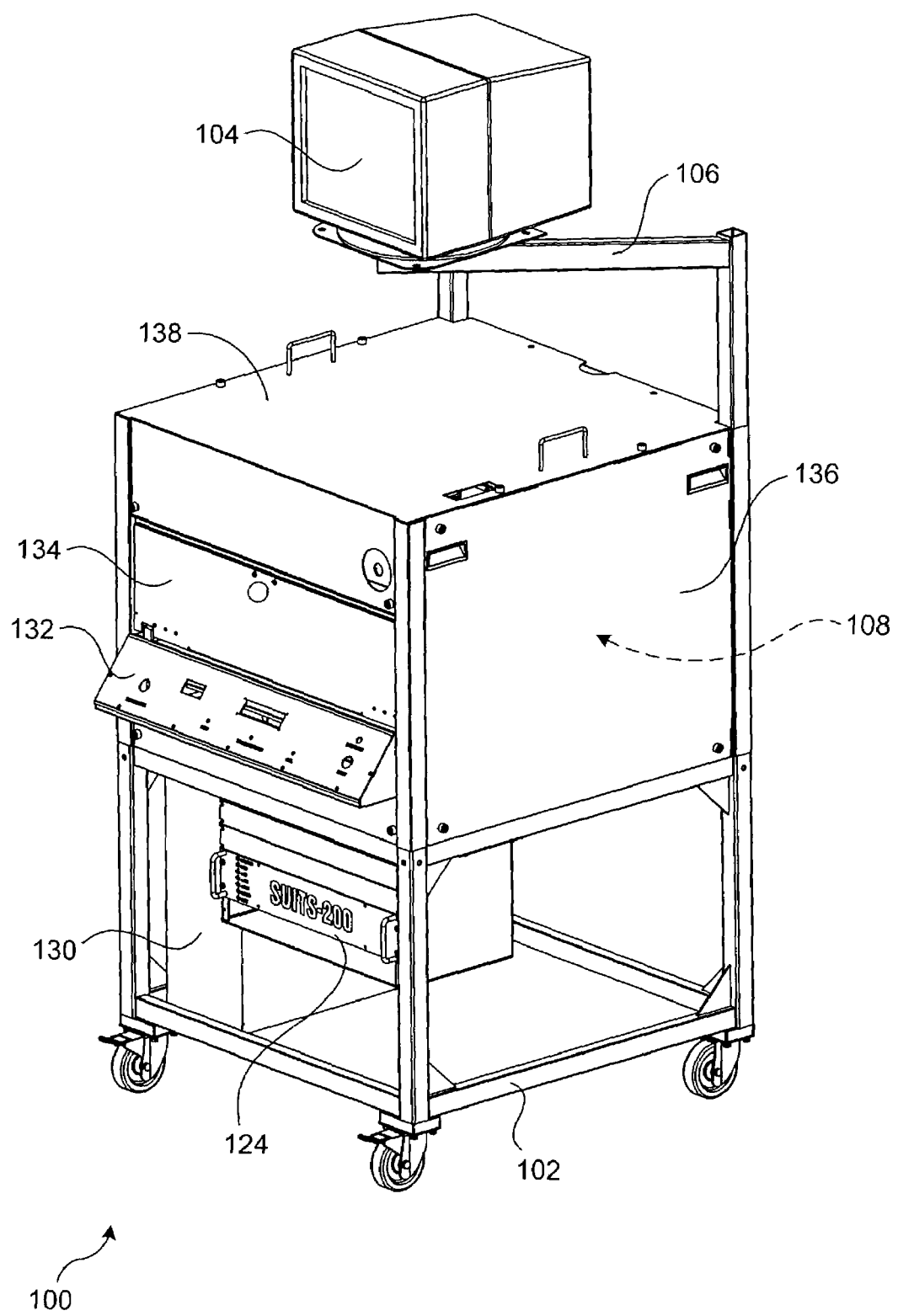

An overview of an embodiment of an automatic circuit board tester 100 corresponding to a Scalable Universal Integrated Test System (SUITS) that implements various aspects of the invention is shown in FIGS. 1A and 1B. Automated circuit board tester 100 includes a frame 102 to which a monitor 104 is attached via a boom 106. An automated connector insertion/probe mechanism 108 is housed within the frame, along with test electronics 110. The automated connector insertion/probe mechanism employs a carrier assembly 112 including a carrier plate 114 to which a circuit board comprising a device under test (DUT) 116 (not shown) is coupled during testing. The mechanism further includes a universal cassette 118 to which a replaceable top probe/connector plate 120 is attached, and a replaceable side access unit (SAU) 122 that is used to connect to various I/O port connectors generally disposed at the rear of the DUT.

The test electronics include various circuit boards that are configured to support a universal test environment via a common (Universal Serial Bus (USB)) communication interface, whereby circuit boards having different configurations may be tested using a common (i.e., universal) tester. This is facilitated, in part, by a universal power supply (UPS) 124 that receives power from a power distribution unit (PDU) 126 and supplies power to DUT 116 and other test electronics components. The test electronics further include a digital video measurement unit (DVMU) 127 and combo board 128 used for audio, analog/digital video and USB 2.0 testing contained within a housing mounted to universal cassette 118.

In general, test operations are controlled by a host computer 130, disposed toward the bottom of the frame, which is linked in communication with the test electronics via USB and serial communication links. More specifically, the host computer is used to execute software comprising a universal host controller (UHC) that is used to control testing of the DUT. The system also includes a control panel 132 to enable user interaction, and provides an access door 134 to allow the DUT to be loaded and to prevent access to the DUT (and associated test electronics) during testing. Furthermore, the tester includes removable side and top panels 136 and 138 that are installed during testing operations so as to prevent access to the DUT and tester electronics, as shown in FIG. 1B.

Figure 2:
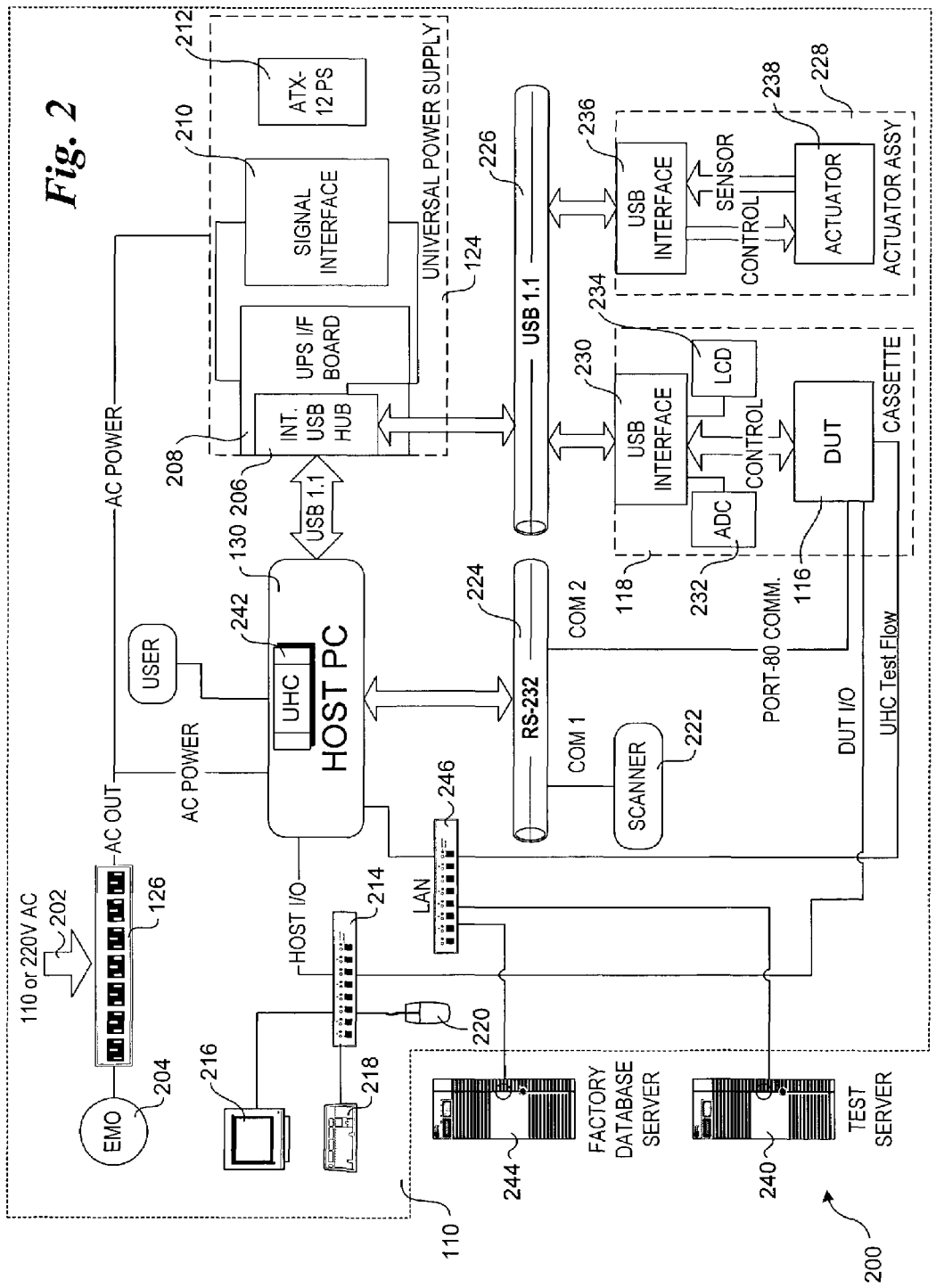
FIG. 2 is a block schematic architecture diagram illustrating various electronic components and interfaces employed by the universal circuit board tester of FIG. 1.

A high-level architecture diagram 200 corresponding to test electronics 110 is shown in FIG. 2. As depicted, an AC power input 202 is supplied to PDU 126. An emergency off (EMO) circuit, depicted as an EMO control 204, provides an input signal to PDU 126 to shut off the output of the PDU upon detection of an emergency off condition and/or activation of an EMO switch (e.g., via operator activation of an emergency off button on the control panel 132). The PDU provides AC power to various system components, including host computer 130 and UPS 124. In one embodiment, the PDU is manufactured by Pulizzi Engineering Inc, Santa Ana Calif.

At a high level, UPS 116 includes an internal USB hub 206 coupled to a UPS interface board 208, a signal interface board 210, and an ATX-12 power supply 212. Further details of the UPS are discussed below with reference to FIGS. 5 and 6.

A first set of I/O cables are connected between host computer and a peripheral device (i.e., I/O) switchbox 214 to enable communication between a monitor 216, keyboard 218, and mouse 220 and the host computer via a second set of I/O cables. A barcode scanner 222 is also linked in communication with the host computer, this time via an RS-232 (i.e., serial) link 224. The RS-232 link further facilitates communication between the host computer and DUT 116 via a port-80 communication channel, wherein this communication link is used for displaying POST (Power On Self Test) codes, as describe below.

The internal USB hub 206 of the UPS serves as a gateway to a USB bus 226, which is used to enable communication with test electronics coupled to universal cassette 118, and to control an actuator assembly 228 that is used to automatically insert various connectors into the DUT and couple various probes to circuitry and components disposed on the DUT. The universal cassette electronics include a USB interface 230, analog to digital conversion (ADC) electronics 232 to measure various power signals at the DUT, and a liquid crystal display 234 that is used to report (i.e., display) various information during the testing operations. The actuator assembly electronics include a USB interface 236, which is used to provide control signals to an actuator 238 and monitor sensor signals from the actuator.

Generally, a plurality of automated circuit board testers 100 may be used in a factory test environment. In one aspect of this type of implementation, a test server 240 is used to host various UHC software versions, whereby appropriate versions of the UHC software 242 may be downloaded from the test server to be executed by a host computer. In another aspect of this type of implementation, a factory database server 244 may be provided to store test results and to retrieve configuration information. As will be readily apparent to those skilled in the art, a single server may be implemented to host the functions provided by both the test server and the factory database server in accordance with one embodiment. Generally, host computer 130 will be linked in communication with the servers via a local area network (LAN) connection, such as an Ethernet link. Such a link may be facilitated by a network switch 246, which may be incorporated into the tester or may comprise part of the LAN infrastructure.

Figure 3:
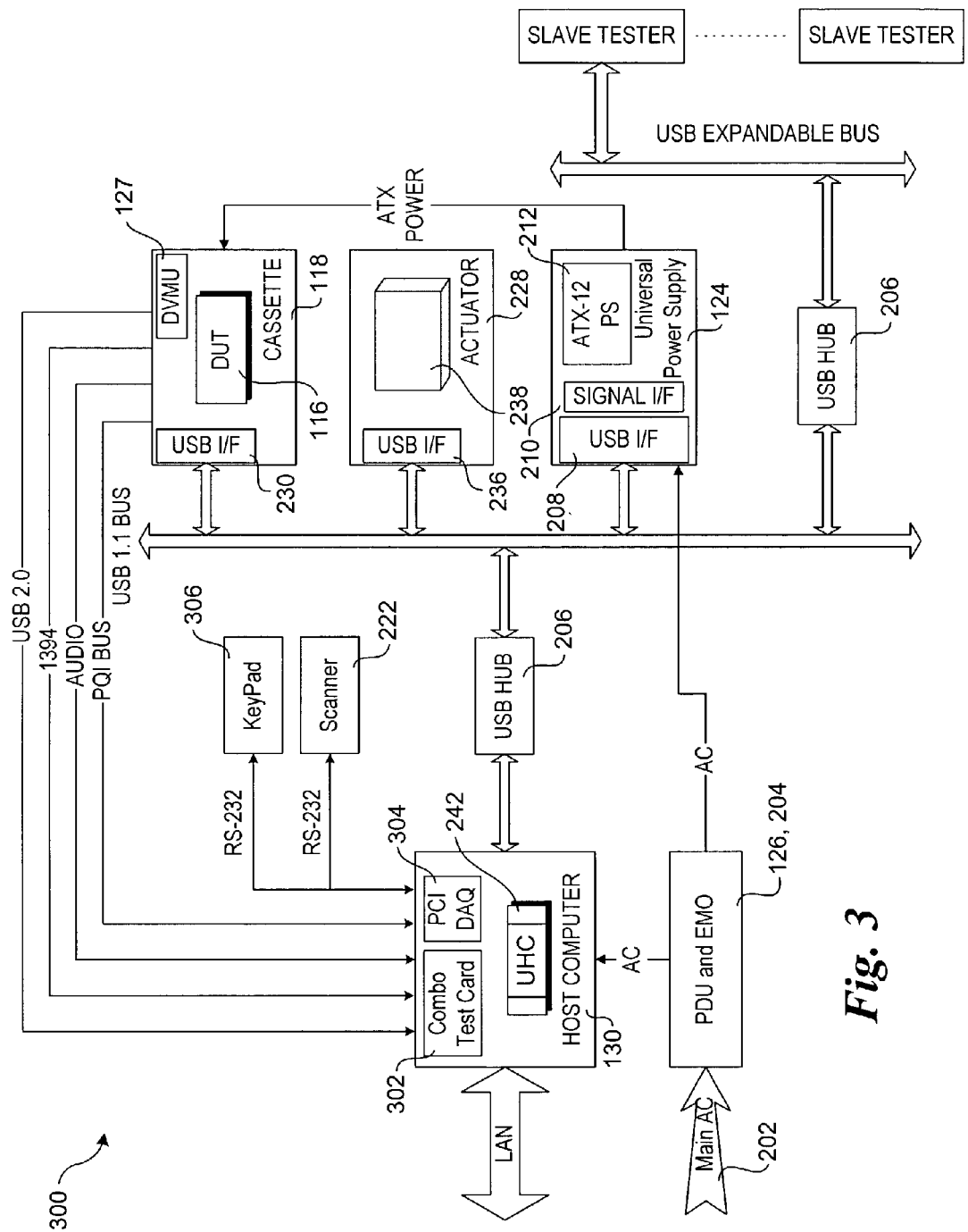
FIG. 3 is a block schematic diagram illustrating various communication paths employed by one embodiment of the automated universal circuit board tester.

A high-level communications diagram 300 is shown in FIG. 3. Host computer 130 is shown to further include a combo test card 302 and a data acquisition (DAQ) unit 304. A keypad 306 has also been added. In general, appropriate cabling and connectors are provided to support communication between the host computer, the universal cassette test electronics, and the DUT over various communication channels. In the illustrated embodiment, these communication channels include a USB 2.0 channel, an IEEE 1394 channel, an Audio channel, and a PQI (prediction quality indicator) bus interface.

Figure 4:
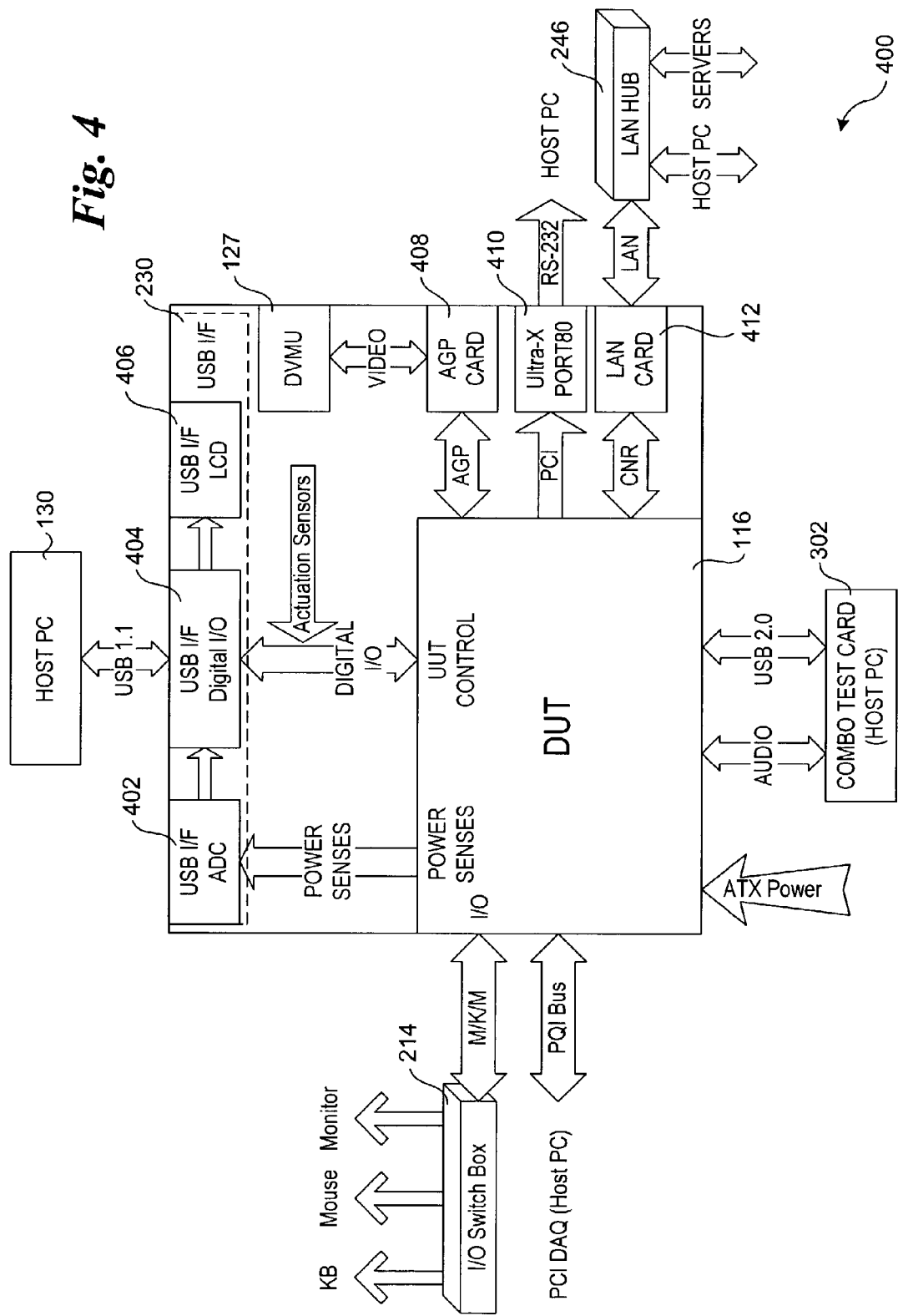
FIG. 4 is a block schematic diagram illustrating electrical components and interfaces employed a top probe unit in accordance with one embodiment of the invention.

An architecture diagram 400 corresponding to a Top Probe Unit (TPU) comprises test electronics that are operatively coupled to the DUT during testing is shown in FIG. 4. The TPU is a USB slave device that includes multiple USB interfaces (I/F), including an USB-to-ADC (analog-to-digital conversion) interface 402, a USB Digital I/O interface 404, and a USB LCD interface 406. In one embodiment, each of USB interfaces 402, 404, and 406 are facilitated by corresponding ActiveWire® USB interface modules, manufactured by ActiveWire, Inc., Palo Alto Calif. The TPU further includes an Advanced Graphic Port graphics card 408 that is operatively coupled to the AGP bus on the DUT during testing, and an Ultra-X Port 80 RS-232 PCI interface card 410 that is operatively coupled to a PCI expansion bus slot on the DUT. In one embodiment, the TPU further provides a LAN network interface card (NIC) 412 that is connected to an appropriate PCI expansion bus slot on the DUT. Optionally, for DUT's with built-in NIC support, that LAN interface is facilitated by a connector connected to the back of the DUT (not shown).

Figure 5:
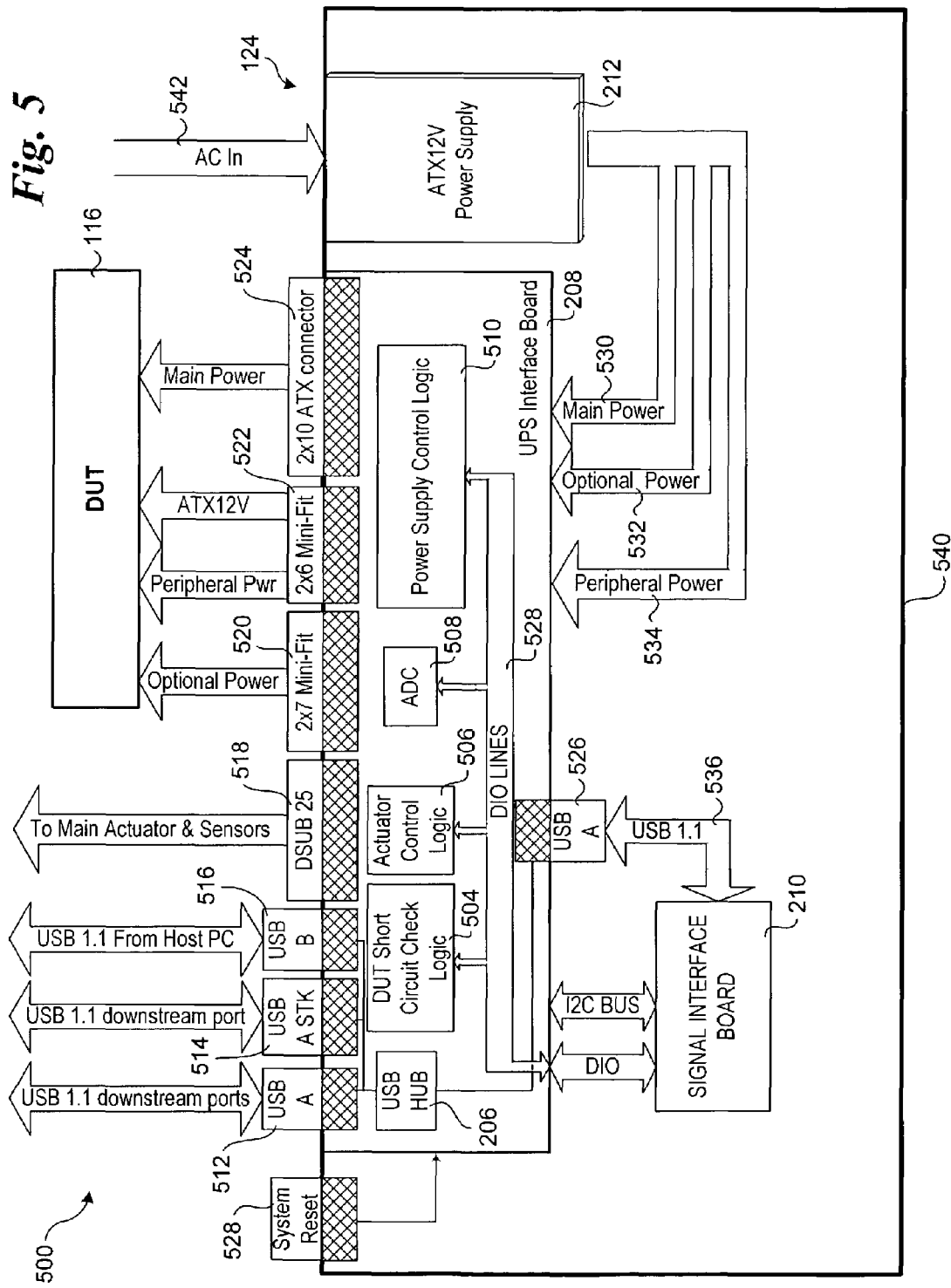
FIG. 5 is a block schematic architecture diagram illustrating various components and logic blocks employed by a universal power supply in accordance with one embodiment of the invention
Figure 6:
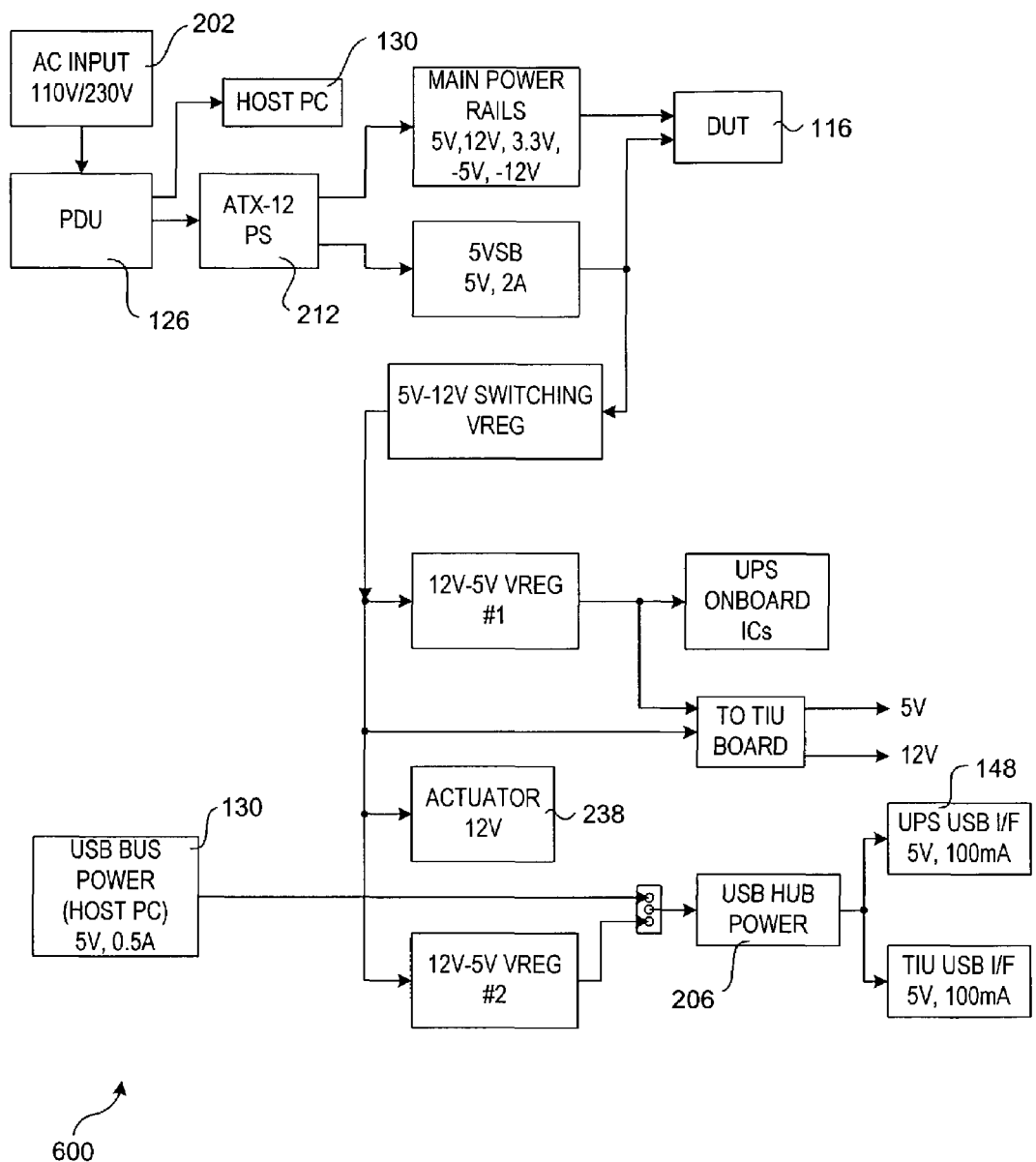
FIG. 6 is a power distribution diagram employed by one embodiment of the invention.

An architecture block diagram 500 corresponding to one embodiment of universal power supply 124 is shown in FIG. 5, while a corresponding power distribution diagram 600 is shown in FIG. 6. The diagram now shows further details of UPS interface board 208, which performs several test control operations, and includes interface circuitry and corresponding interface connectors. In addition to USB hub 206, the UPS interface board includes programmable circuitry corresponding to a DUT short circuit check logic block 504, an actuator control logic block 506, analog-to-digital conversion operations corresponding to an ADC block 508, and power supply control logic, depicted by a block 510.

As discussed above, the universal power supply supplies power to the various circuit board types supported by the system. In cases in which the DUT comprises a computer system board, appropriate power input must be supplied to DUT, typically in response to power input sequencing signals provided by the DUT. Under normal (i.e., non-test) use, a computer system board will typically be housed in a chassis that also includes a power supply configured to support the computer system board type. During boot-up operations, power sequencing signals are generated by the computer system board and supplied as input signals to the power supply, which outputs corresponding power levels on various wires in response thereto. Through the use of power supply control logic block 510 and other control aspects, the universal power supply is able to provide appropriate power sequencing and power levels to a variety of different board types.

The universal power supply includes several interface connectors for data communications and power input functions. These include, external USB ports 512, 514, and 516, a 25-pin DSub connector 518, a 2×7 Mini-fit connector 520, a 2×7 Mini-fit connector 522, and a 2×10 ATX power connector 524. Each of these connectors are standard well-known connectors that are mounted to the UPS interface board 208, and are disposed at the back of the UPS housing to enable cable access to the connectors. An internal USB port 526 is also mounted to the UPS interface board to enable communication via a USB link with signal interface board 210. Each of the USB ports is internally linked to USB Hub 206, thereby enabling signals received or sent via USB port 516 to be passed to the other USB ports. The UPS also provides a connector 528 via which a system reset signal may be received to cause a system reset operation to occur.

Power input is supplied to the DUT via cables connector to connectors 520, 522, and 524. The power is originally supplied as inputs to UPS interface board 208 from ATX power supply 212, as depicted by a "Main Power" input 530, an "Optional Power" input 532, and a "Peripheral Power" input 534. The UPS interface board then provides appropriate power to DUT 116 as defined by the power supply control logic in response to applicable power sequence/control signals.

In accordance with one aspect of the universal power supply, the device may be entirely controlled by host computer 130 via a single (USB) communication interface. USB hub 206 also enables USB communication signals to be routed over other USB links. This enables USB communication with other components of a given system. It also enables multiple test stands to be linked together in a daisy-chain fashion, thereby enabling a signal host computer to control multiple test stands. A further aspect of the USB control scheme corresponds to the ability to communicate with downstream components that are not linked to the UPS (or even the host PC) via a USB link.

The UPS includes a means for measuring the voltage levels of the power input supplied to the DUT via ADC 508. In one embodiment, the ADC comprises a 10-bit resolution ADC, model number TLV1548C manufactured by Texas Instruments. During the testing, the voltage levels are monitored to verify they fall within predefined limits. If a voltage level limit is exceeded (over-voltage or under-voltage), the power supply control logic will detect the condition and shut down the power supply output to the DUT.

The signal interface board 210 is used to provide an interface between USB signals, and other data signals used by the UPS interface board, as respectively depicted USB 1.1 signals 536 and DIO (digital input/output) lines 538. For example, signal interface board 210 provides a communication interface that enables actuator command signals corresponding to a predefined command set to be sent over a USB link to the UPS (e.g., via USB port 516 from the host computer), whereupon they are received by the signal interface board, and converted into DIO-compatible signals that are passed to actuator control logic block 506. The actuator control block interprets the signals it receives, and causes an appropriate control signal to be sent to the actuator via 25-pin DSub connector 518. This signal interface also supports communication back to the host PC over the USB link, such as providing the results of the short circuit test operations described below, which is performed by DUT short circuit check logic 504.

The UPS also proves an EOS (Electrical Overstress) function. The EOS function may be turned on and off via an EOS_CTRL signal that is received via a USB link. This function is turned on at the end of a test (after power off) to ensure that all the power rails on the DUT are properly drained to ground.

In general, the various components of the USB described above will be packaged within a housing 540. In one embodiment, the housing corresponds having a 2U rack-mountable form factor. The housing is configured such that each of the connectors disposed at the top side of the unit are accessible. Additionally, AC input power 542 may be supplied to power supply 212 via a conventional power input connector, such as a Beldon connector.

Automated Connector Insertion Kinematics and Universal Mechanical Interface

With reference to FIGS. 9A–C, and 10A–C, further details of automated connector insertion/probe mechanism 108 are now disclosed. In one embodiment, a single linear actuator is employed to cause concurrent actuation about four orthogonal axes. In one embodiment the linear actuator comprises a pneumatic cylinder 900, which has a body coupled a carriage 902 and a rod operatively coupled to frame 102 (not shown). The concurrent multi-axis actuation includes a vertical actuation that is used to vertically move the DUT so that it engages various connectors and probes disposed on the underside of top probe/connector plate 120. This is enabled, in part, by means of four vertical actuation guide ramps 904 (not shown in FIG. 9A), which are mounted on carriage 902. Carriage 902 rolls on a plurality of wheels 906 mounted within a frame 908 that is mounted to frame members 910.

A vertical push plate 911 is provided to push carrier assembly 112 upward. Four brackets 912 are coupled to the underside of vertical push plate 911. A respective cam follower 913 is coupled towards the bottom of each of brackets 912 and is sized to fit within a corresponding slot 914 formed in vertical actuation guide ramps 904.

Carrier assembly 112 includes a carrier frame 916 to which a pair of linear bearings 918 are coupled. Likewise, a pair of similar linear bearings 919 are coupled to vertical push plate 911. Each of linear bearings 916 and 917 slidingly engage a mating vertically-disposed linear bearing shaft 920 that is operatively coupled at its respective upper and lower ends to frame 102.

A drawer slide 922 is coupled between carrier frame 916 and a carrier plate support 924 on which carrier plate 114 rests to enable the carrier plate to be pulled forward relative to the carrier frame, thereby enabling a DUT that has just completed testing to be removed and a new DUT to be installed on the carrier plate. A knob 926 is provided to further assist an operator in pulling and pushing carrier plate 114.

In addition to a vertical actuation axis, three horizontal actuation axes are also provided. These actuation axes correspond to respective side activation unit (SAU) actuators, which are used to actuate SAUs 122 (removed from clarity in FIGS. 9A–9C). Each SAU actuator comprises a SAU carriage 928 that is enabled to move linearly relative to carrier frame 916 by means of end linear bearing assemblies 930 and a center linear bearing assembly 932. Each SAU carriage further includes a pair of cam followers 934 that engage respective SAU actuation ramps 936 during SAU actuation.

Figure 9A:
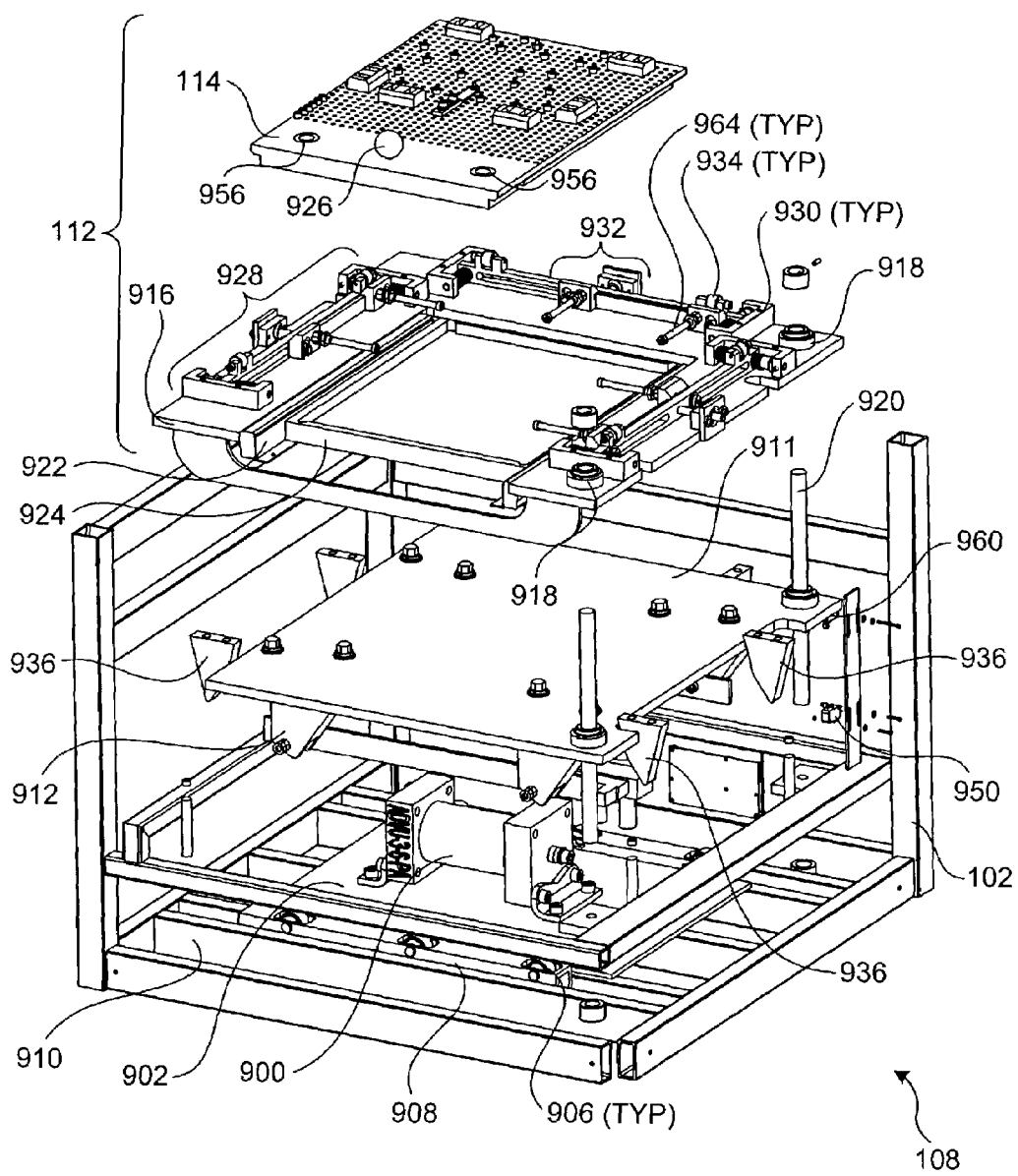
Figure 9B:
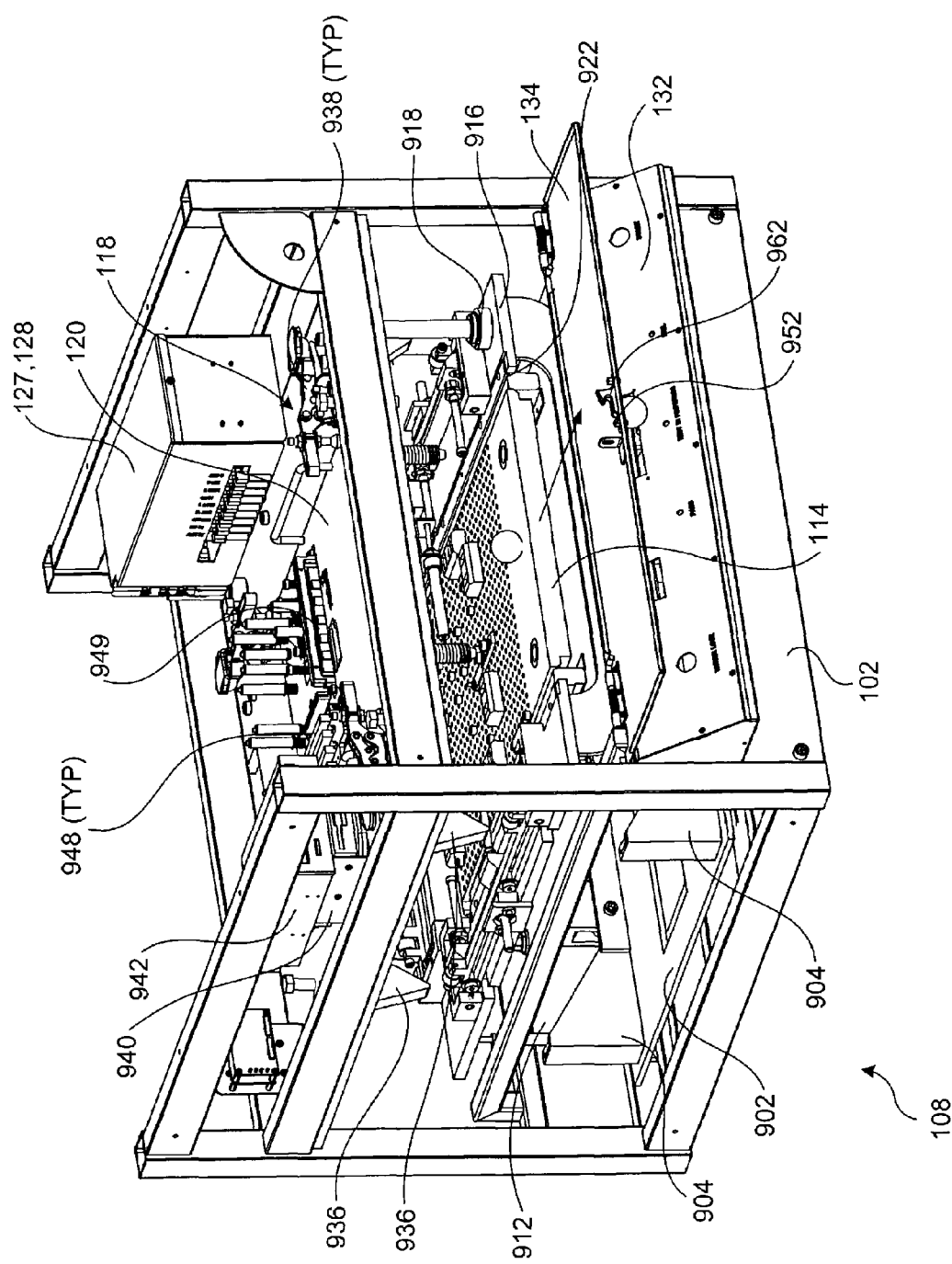
Figure 10A:
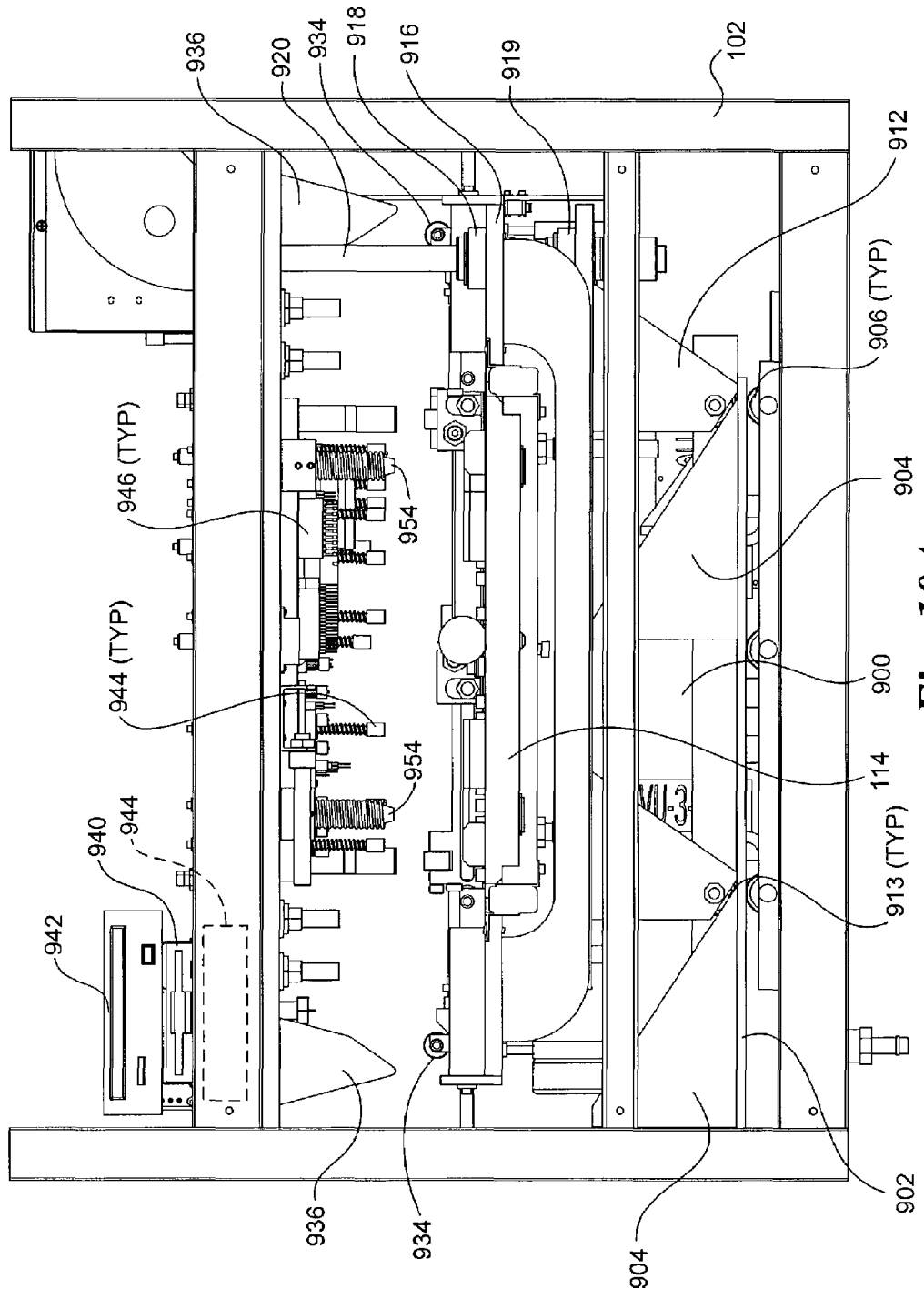
FIGS. 10A, 10B, and 10C respectively show fully disengaged, middle, and fully engaged actuation states corresponding to an actuation cycle of the automated probe/connector insertion mechanism.

Further details of universal cassette 118 and top probe/connector plate 120 are shown in FIGS. 9B and 10A. The combination of universal cassette 118 and top probe/connector plate 120 are designed to enabling testing of various DUT board types, wherein the functions provided by universal cassette 118 are "universal" to all board types, while top probe/connector plate 120 is configured for a certain board type or set of board types. Accordingly, mounting provisions are provided to enable top probe/connector plate 120 to be swapped out. These include a set of toggle clamps 938 and plate alignment means that are used to align the top probe/connector plate relative to the universal cassette.

Universal cassette includes various components that are used to simulate the DUT functioning within an actual work environment, such as within a computer. These include a floppy drive 940, a CD-ROM drive 942, and a hard disk drive (disposed beneath the floppy drive). Generally, the interfaces to each of these devices are provided via connectors coupled on the underside of top probe/connector plate 120. Optionally, such connectors may be disposed on the underside of the universal cassette when the DUT types share a common configuration for such connectors.

Typically, different board types will have different connector/component layout configurations. Accordingly, each top probe/connector plate 120 will be configured for a corresponding board type or set of types. This means that the various probes 944 and connectors 946 will be configured, both in orientation and type, so as to mate with corresponding target pads/traces/components and connectors for the DUT type. In addition to general connector types, such as power, and peripheral device (e.g., disk drives, IDE, etc.) connectors, one or both of the top probe/connector plate and universal cassette may employ peripheral (expansion) bus extenders 948, which enable various types of peripheral boards, such as video boards, sound boards, network interface cards (NICs), SCSI cards, special purpose cards, etc., to be operatively coupled to the DUT during testing operations.

Another aspect of the automated insertion capabilities of the system is the ability to automatically insert memory and/or microprocessors. For example, the top probe/connector plate may be configured to hold one or more DIMMs (dual inline memory modules) 949, which are inserted into corresponding DIMM connectors on the DUT. Additionally, if the DUT type employs a removable processor, such as a slot 1 processor, a corresponding processor may be mounted to the top probe/connector plate and inserted into a corresponding connector on the DUT.

Further details illustrating an actuator motion cycle are shown in FIGS. 9A–C and 10A–C. FIGS. 9A and 10A show an initial configuration corresponding to a fully-disengaged actuation condition. Under this condition, the pneumatic cylinder is fully retracted such that cam followers 913 are at the bottom of vertical actuation guides 904. While in this position a lower position switch 950 will be engaged, which will enable access door 134 to be opened, thereby enabling an operator to install or remove a DUT. After the access door has been shut, the actuator sequence may begin. The position of the access door is sensed by a door engagement sensor 952.

Figure 10B:
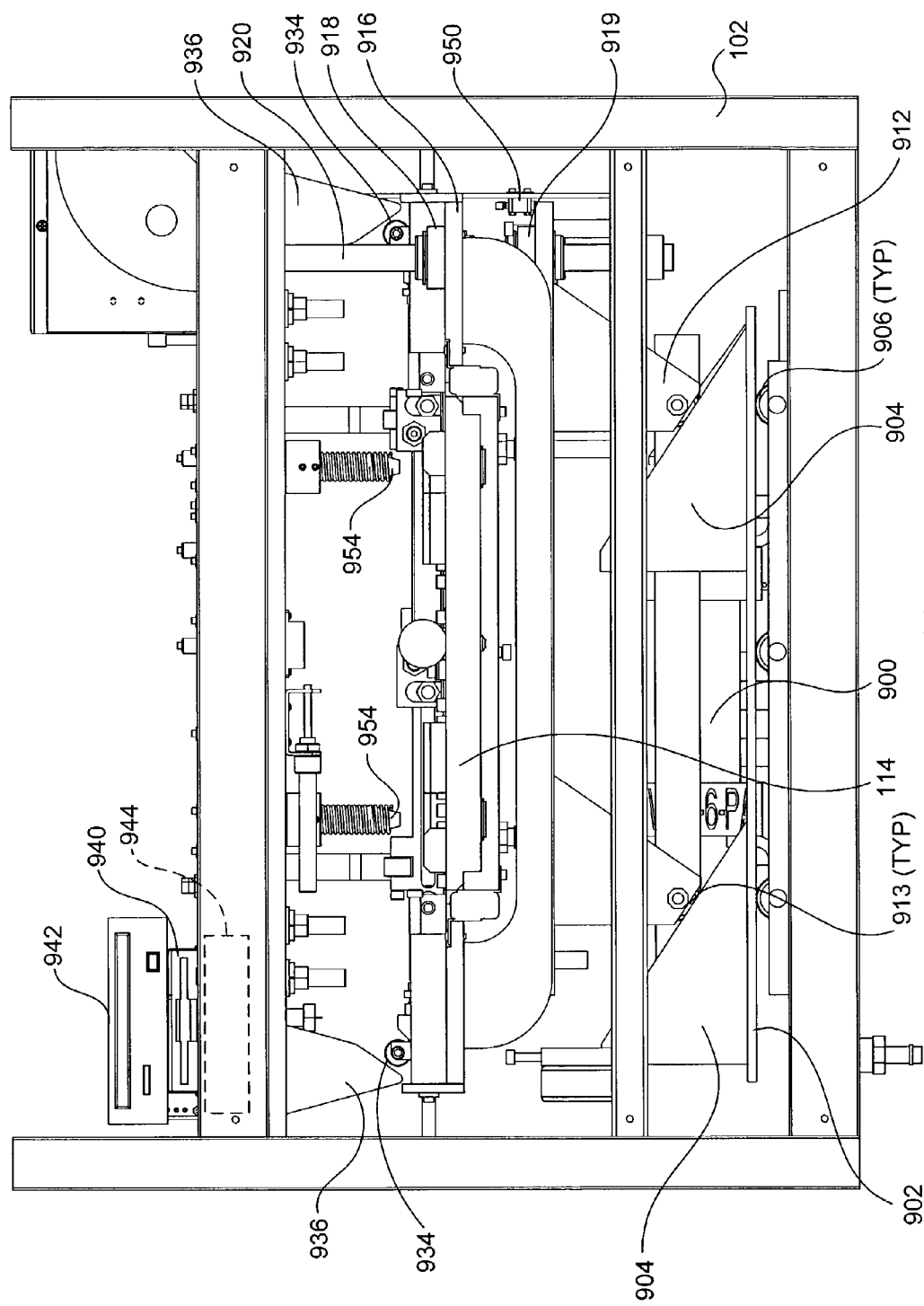

A mid actuation position is shown in FIGS. 9B and 10B. In this instance, a valve is positioned to enable air to flow into pneumatic cylinder 900, causing the cylinder's rod to be extended. This cause carriage 902 to move toward the left, which pushes vertical push plate 911 upward by means of engagement of cam followers 913 with vertical actuation guide ramps 904. As is further shown, SAU cam followers 934 are about to engage SAU actuation ramps 936. Furthermore, carrier plate 114 is positioned such that it is just below a pair of alignment posts 954.

Figure 10C:
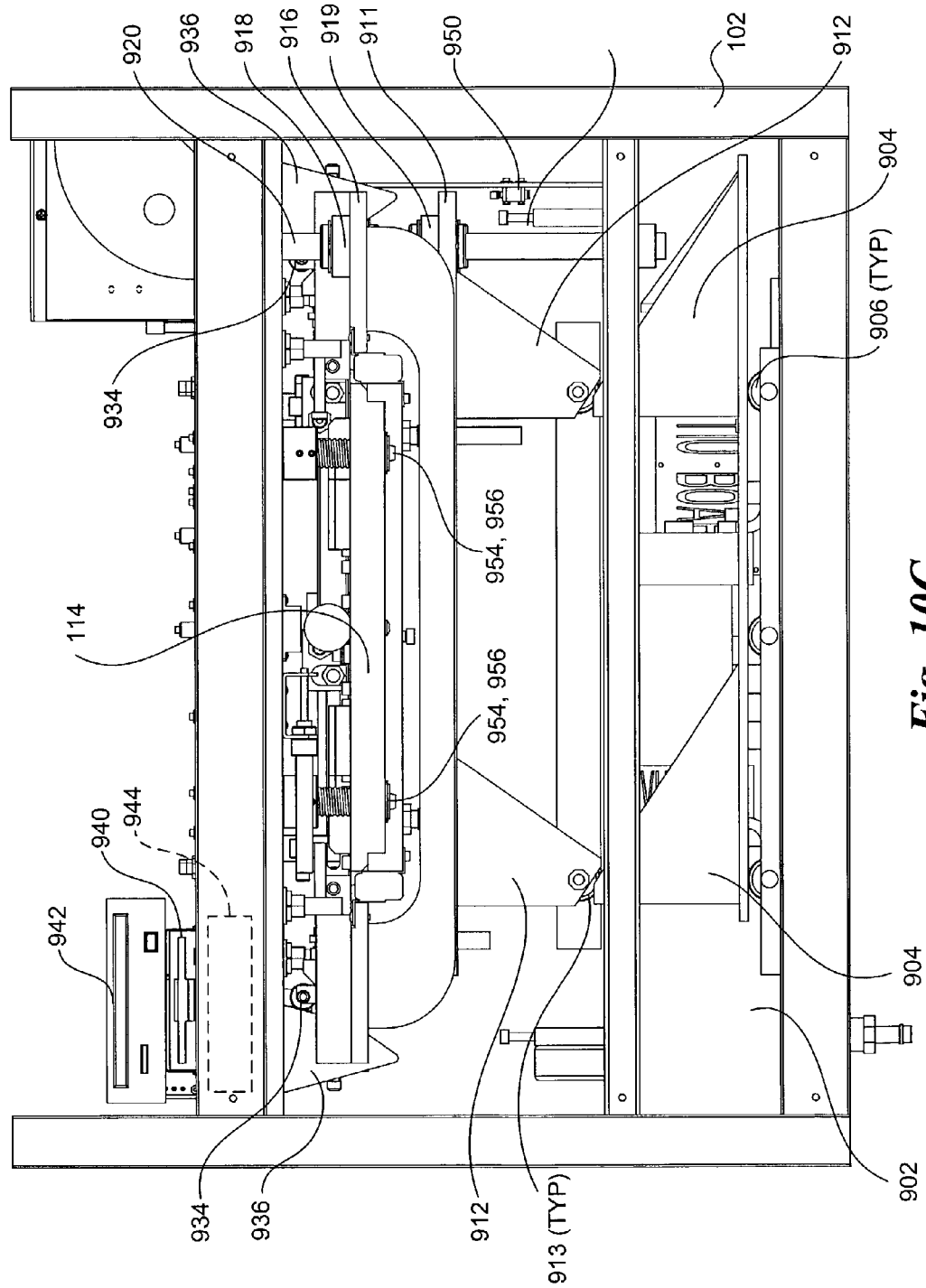

A fully-engaged position is shown in FIGS. 9C and 10C. As vertical push plate 911 is pushed upward, it engages carrier frame 916, which in turn supports carrier plate 114, pushing the carrier plate upward in turn. As the carrier plate moves upwards, a pair of bushings 956 disposed in the plate begin to engage alignment post 954. Since the carrier plate is "floating"on carrier plate frame 924, the carrier plate is enabled to self align to the alignment posts. As the carrier plate is lifted in proper alignment via the alignment posts, various connectors 946 are engaged with corresponding connectors on the DUT, as well as various probes engaging with target traces, pads, components etc. At the same time, memory DIMMs, a CPU, and peripheral expansion bus connectors are also coupled, dependent on the particular DUT type configuration. This completes the vertical part of the automated test probe/connector insertion. Once the carriage assembly is at the top of the actuation cycle, testing operations may begin. This condition is indicated by a fully-engaged (ACTUATOR$_{13}$ FULL$_{13}$ UP) position sensor 960.

In concurrence with the foregoing vertical actuation, horizontal actuation of the SAUs is performed. As the carriage assembly moves upward, SAU cam followers 934 engage SAU actuation ramps 936, causing SAU carriages 928 to be moved horizontally inward. As a result, the connectors on the SAU (shown in Figure 11) become engaged with corresponding connectors on the DUT. For example, a typical DUT may comprise an ATX-compatible motherboard, which includes a plurality of connectors having a predefined configuration that are mounted to the motherboard such that they can be horizontally accessed from opening in the case in which the motherboard is to be installed. These connectors typically include serial and parallel ports, as well as a keyboard port, a mouse port, and optional USB, game/audio ports, and network ports. Other types of ports may be provided as well.

An exemplary SAU 1100 is shown in FIG. 11. SAU 1100 includes a frame 1101 comprising a front plate 1102 and a back plate 1104, which are coupled together by means of a plurality of fasters 1006 and standoffs 1008. A pair of through holes 1100 are drilled through each of the front and back plates to enable the frame to be coupled to a SAU actuator 928 via bolts 964 (See, e.g., FIG. 9A). The SAU frame is used to hold a plurality of connectors coupled to front plate 1102, including a keyboard port connector 1112, a mouse port connector 1114, a first pair of USB connectors 1116, 1118, and an IEEE 1394 connector 1120. The connectors further include a 9-pin SubD serial port connector 1122 and a 25-pin SubD parallel port connector 1124. An RCA audio connector 1126 is disposed beneath the parallel port connector, along with a fiber optic connector 1128. A set of audio jacks 1130 are disposed to the left of the parallel port connector, along with provisions for a pair of additional audio jacks 1132 to support future five-way audio interfaces. A second pair of USB connectors 1136, 1138 are disposed toward the left end of the front plate, along with a conventional network RJ-45 connector 1140.

Generally, the various connectors and jacks are arranged in a manner corresponding to a standard configuration, such as the ATX standard. It is not required that all of the connector and jacks be used, and in fact different SAUs may be employed for different DUT type configurations.

Each of the various SAU connectors and jacks is connected to a cable that is used to carry signals to corresponding test electronics discussed above with reference to FIGS. 2–4 (not shown in FIG. 11). These include a keyboard cable 1142, a mouse port cable 1144, an IEEE 1392 cable 1146, a serial cable 1148, a parallel cable 1150, and a network cable 1152. Each of these cables include an appropriate mating connector, as would be commonly employed in computer systems and the like. In the illustrated embodiment, wires 1154 connected to the various audio jacks are commonly coupled to a connector 1156.

In one embodiment, one or more of the connectors/jacks are spring loaded, such as depicted by springs 1158 and 1160 in the illustrated embodiment. The springs enable different forces to be applied to individual connectors and jacks when the SAU is urged forward to couple corresponding connectors/pins on the DUT, and maintain a constant force on connectors/jacks during the testing operations.

In some instances, only one of the three SAU axes may be employed, such an axis that enabled connectors to be inserted at the back of the DUT via a corresponding SAU. Under such situations, either or both of the side SAU actuators may be removed.

Reconfigurable "Programmable" Carrier Plate

Figure 12:
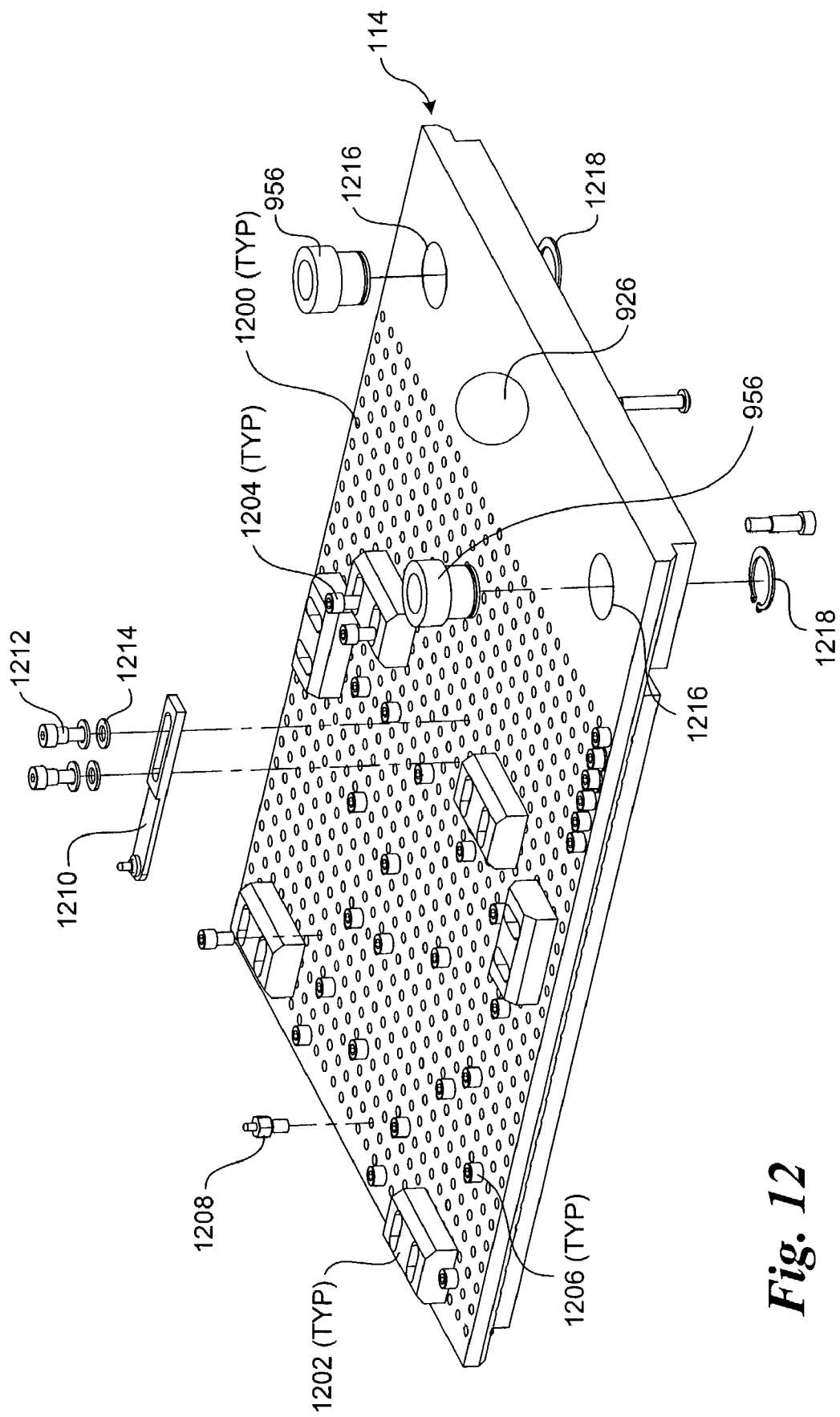
FIG. 12 shows an isometric view of a programmable circuit board carrier plate.

With further reference to FIG. 12, carrier plate 114 provides a universal circuit board mounting platform that may be adapted (programmed) to secure DUTs having a variety of different form factors. The carrier plate includes a grid of threaded holes 1200. The threaded holes enable various alignment blocks 1202 to be positioned anywhere within the grid area via corresponding threaded fasteners 1204. They also enable threaded fasteners 1206 to be located so as to support the DUT at desired locations. Typically, threaded fasteners 1206 may comprise plastic fasteners to electrically isolate the DUT from the carrier plate Preferably, threaded holes 1200 will be arranged in an accurate grid. In one embodiment ¼–20 holes are arrayed in a 0.500 inch grid pattern. This enables accurate alignment of DUTs to the carrier plate (and thus indirectly to top probe/connector plate 120). In some implementations, sufficient alignment may be facilitated by alignment blocks 1202 alone. In other instances, it may be desired to use one or more alignment pins 1208.

DUTs may generally be secured to the carrier plate via one or more securing means. In one embodiment, one or more clamping bars 1210 are employed to secure the DUT to the carrier plate. Typically, clamping bars 1210 are secured to carrier plate 114 by means of shoulder screws 1212 and washers 1214.

As discussed above, a pair of alignment bushings 956 are disposed within holes 1216 formed toward the front corners of carrier plate 114. In one embodiment, the alignment bushings may be secured via a light press fit. In another embodiment, a "C" ring 1218 is coupled toward a groove 1220 formed in the base of alignment bushing 956, whereby the alignment bushing is secured via engagement with a shoulder 1222 on the top side of the carrier plate and the C ring on the bottom side of the carrier plate.

Universal Host Controller Software

As discussed above, control of the testing operations is provided, in part, by universal host controller software 242 running on host PC 130. A flowchart illustrating various operations performed during a test sequence in accordance with one embodiment of the invention is shown in FIGS. 7a–h. The process begins in a block 700, wherein a user scans the serial number of the DUT (e.g., computer system board) with scanner 222, wherein the UHC software reads the serial number via the RS-232 connection with the scanner. In response, the host computer submits a request to factory database server 244 in a block 702 to obtain permission for the DUT to be tested. The database will also provide the product code and operation ID (OPID) information of the DUT. The OPID will tell the UHC software if the DUT is at a valid location in the factory, for this case, the SUITS-200 Functional Test area. UHC uses the product code information to verify that the DUT is tested with the correct probe plate and side-access unit (SAU).

In blocks 704, 706, and 708, an operator puts the DUT on the carrier plate, pushes the carrier plate in, and closes access door 134, respectively. The operator then presses the START button on control panel 114 to initiate the beginning of the automated test process, as depicted by a block 710. The UHC detects the start of the test by monitoring for a corresponding start signal on USB interface 230. Upon detecting a valid start signal, a stop# bit is checked in a block 712 to determine whether the tester is available or is locked. Continuing to FIG. 7b, if the stop# bit is asserted (low), the UHC software reports that the tester is locked, in accordance with a decision block 714 and a block 716. If the bit is not asserted, a timestamp indicating the start of the test is recorded and displayed on LCD 234.

Next, in a block 718, the carrier plate sensor is checked to verify the carrier plate is in the proper position. If it is not, the test is stopped, and the UHC software reports (via LCD 172) that the carrier plate is not closed in accordance with a decision block 720 and a block 722. In a block 724, the door sensor is checked. If the sensor indicates the door is not locked, the test is stopped and the UHC software reports that the door is not closed in accordance with a decision block 726 and a block 728. If the door is in its proper position, the door is automatically locked in a block 728 via actuation of an electronic lock 962.

Figure 7A:
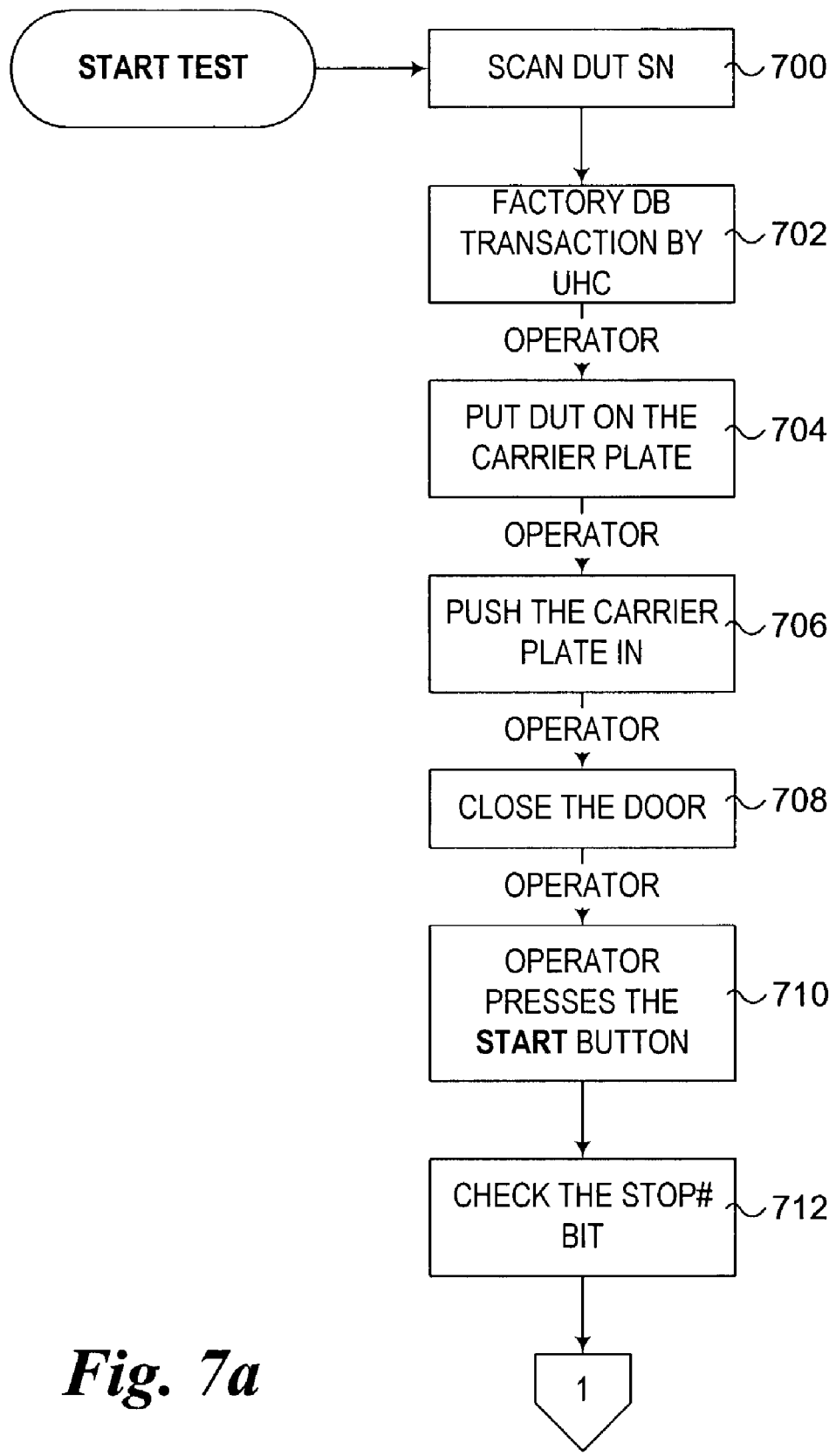
FIGS. 7a–h collectively comprise a flowchart illustrating operations and logic performed by the tester during test operations in accordance with one embodiment of the invention.
Figure 7B:
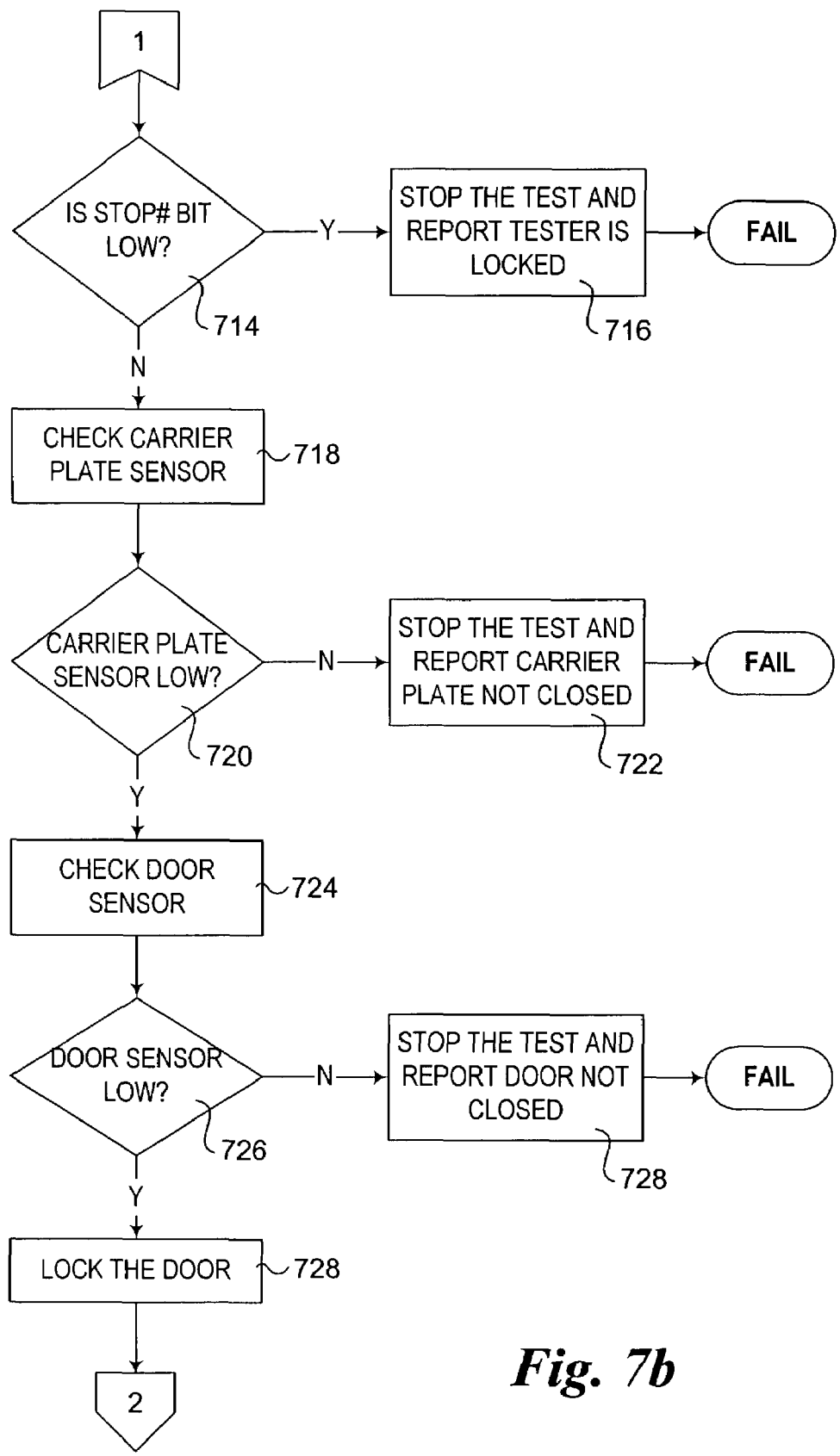
Figure 7C:
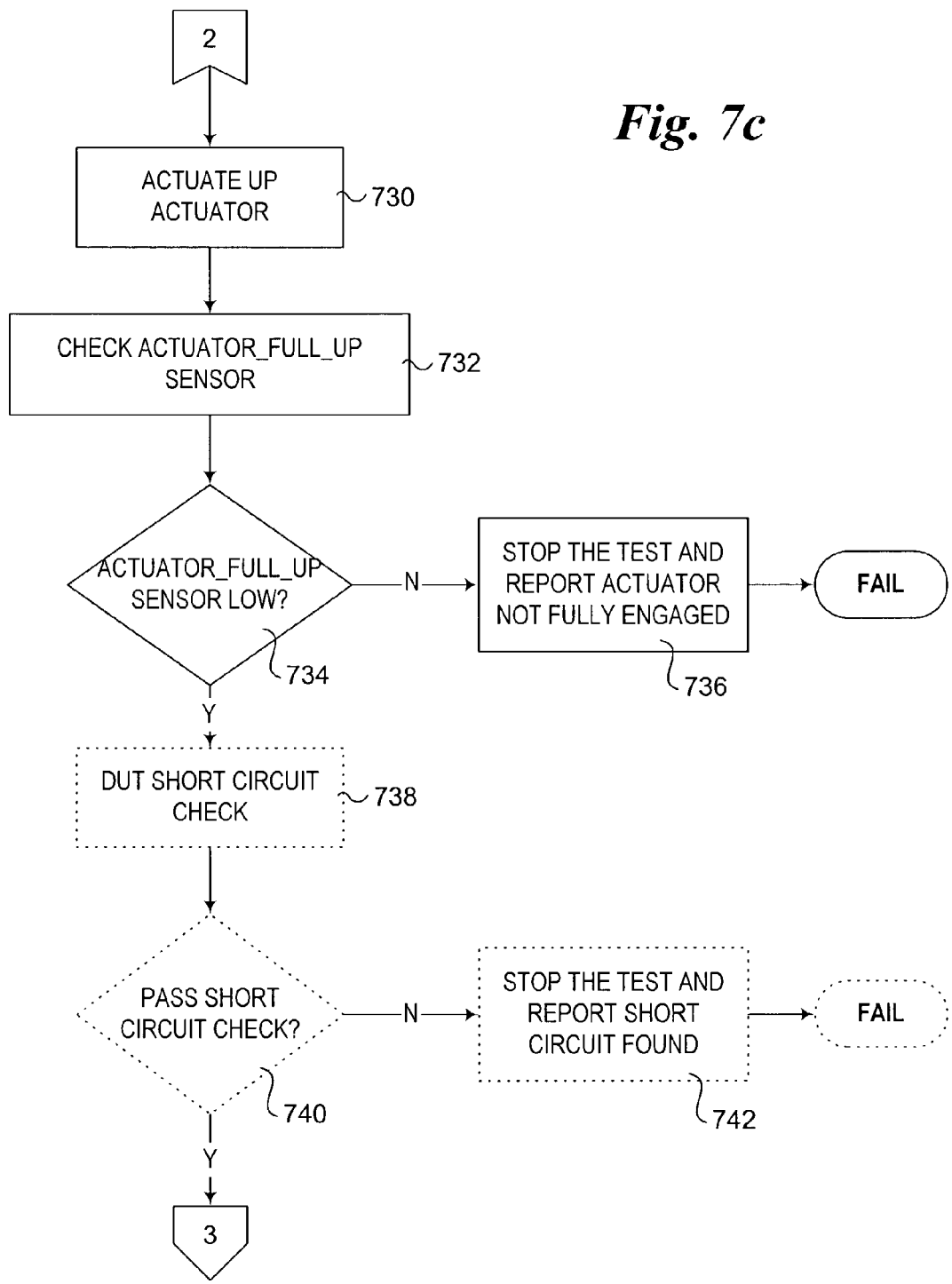

Moving forward to FIG. 7c, the up actuator (i.e., pneumatic cylinder 900) is actuated in a block 730. This causes the DUT to be raised into contact with corresponding connectors and test probes disposed on the underside of the universal cassette 118 and top connector/probe plate 120. It also positions SAUs 122 to engage various connectors disposed at the rear and/or sides of the DUT. In a block 732, the ACTUATOR_FULL_UP sensor (960) is checked, and a determination of its position is made in a decision block 734. If the actuator not is fully engaged, the ACTUATOR_FUL- L_UP sensor will read low, causing the test to be stopped and the UHC software to report that the actuator is not fully engaged in a block 736.

Once the actuator is fully engaged, a DUT short circuit test is performed in a block 738, further details of which are discussed below. In a decision block 740 a determination is made to whether the short circuit test is passed. If it has not, the test is stopped and the UHC software reports that a short circuit has been found in a block 742. As indicated by the dashed outline of the blocks, the short circuit test is an optional test, which may be enabled by a corresponding entry in a software initialization file.

Figure 7D:
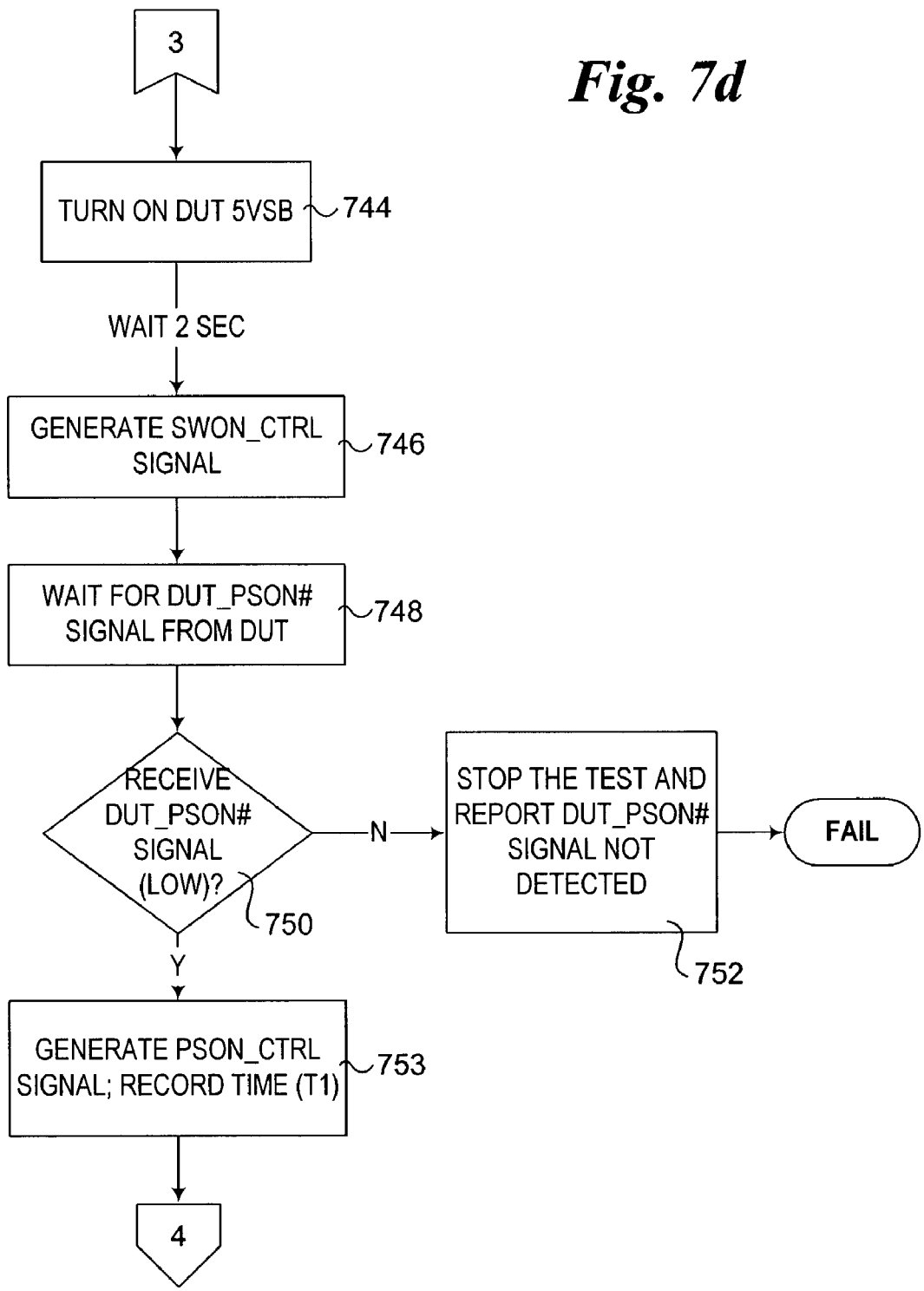
Figure 7E:
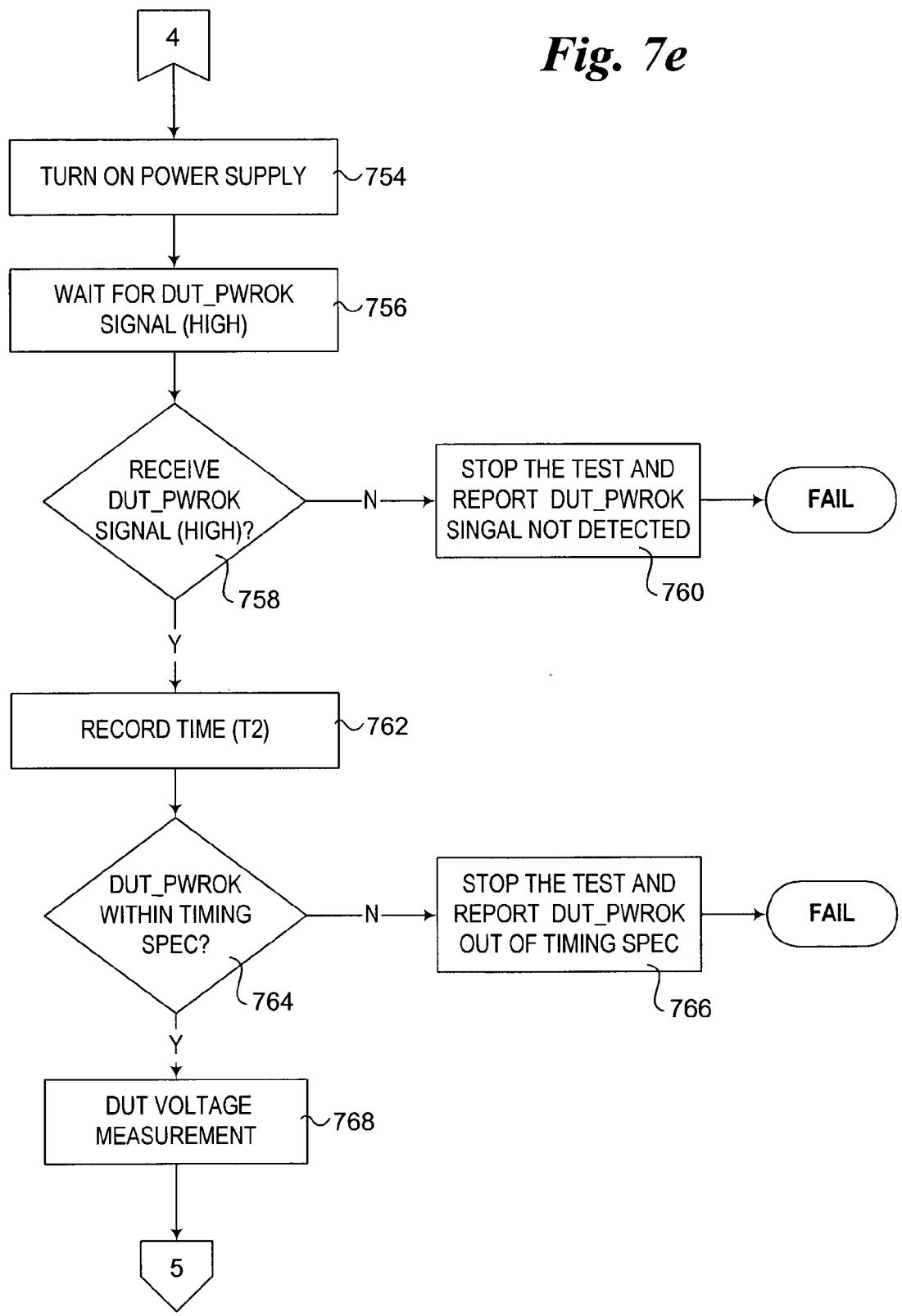
Figure 7F:
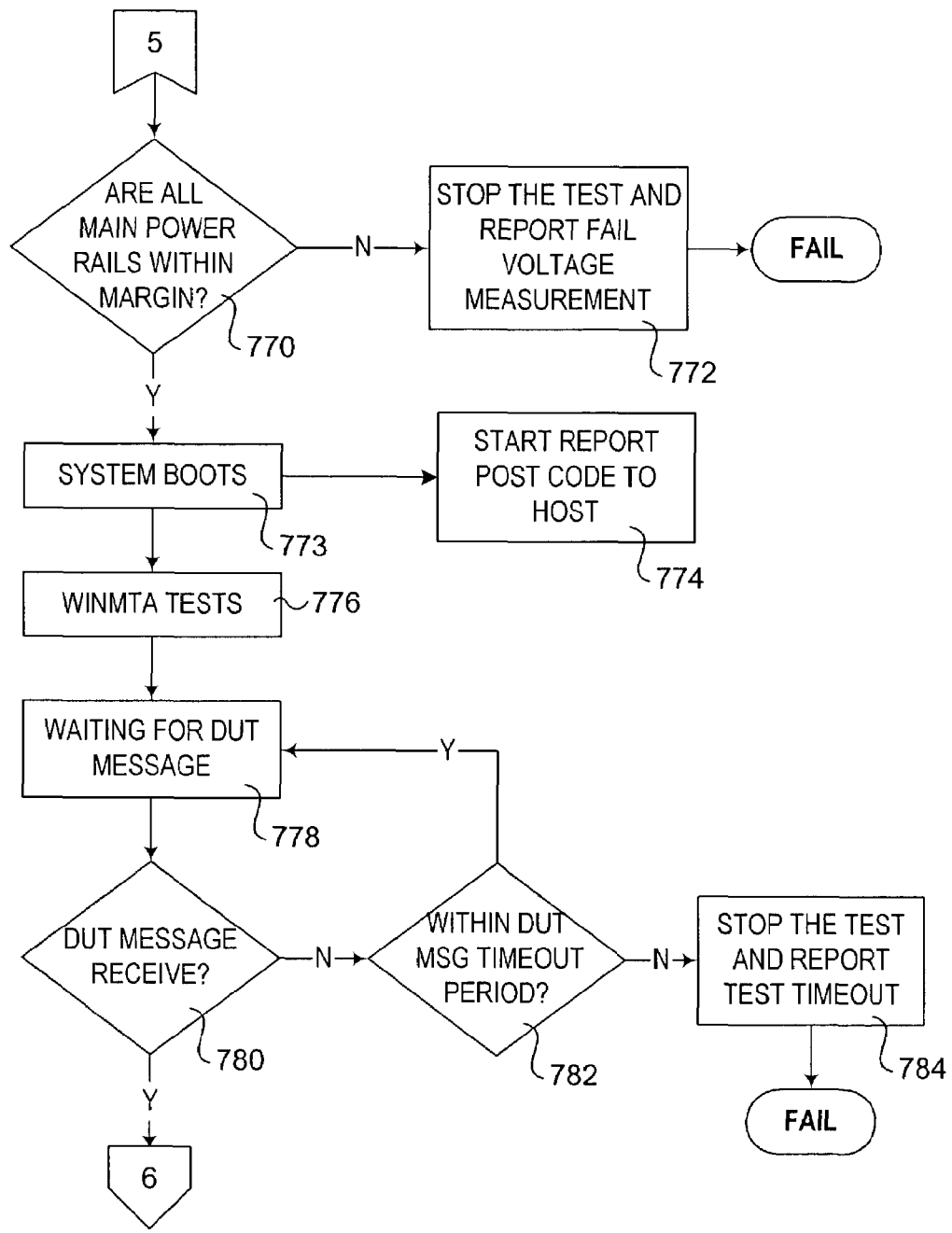
Figure 7G:
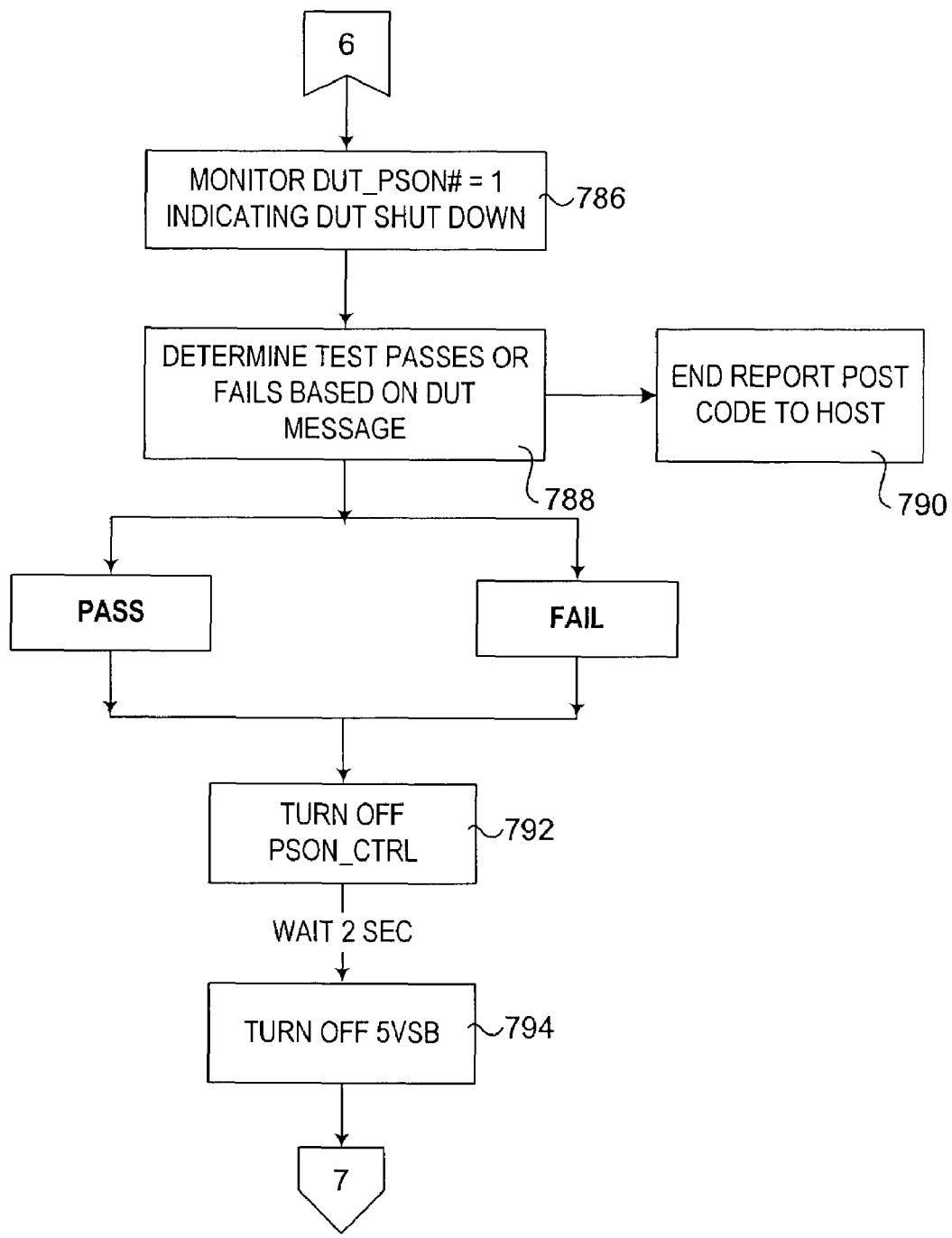

As shown at the top of FIG. 7d, the next operation comprises turning on the DUT 5V standby voltage (5 VSB) in a block 744. After a two-second wait, a switch on control signal (SWON_CTROL) comprising a two-second SWON# pulse is generated in a block 746. In accordance with block 748 and 752 and a decision block 750, once the SWON# pulse is generated, the UHC software monitors for the occurrence of a power supply on (low) signal from the DUT (DUT_PSON#). If a DUT_PSON# low signal is not detected within two seconds, the test and stopped and corresponding information is reported.

In response to receiving a low DUT_PSON# signal, a PSON_CTRL (power supply on control) signal is immediately driven to high in a block 753, and the time is recorded (T1). Next, as shown by a block 754 at the top of FIG. 7e, the power supply is turned on, and the UHC software monitors for a DUT power OK (DUT_PWROK) signal in a block 756. If a DUT_PWROK (high) signal is not detected, the test is stopped and a corresponding report is made in accordance with a decision block 758 and a block 760. Once the DUT_PWROK signal goes high, the time is records (T2) in a block 762, and a determination is made in a decision block 764 to whether or not the DUT_PWROK timing (i.e., T2–T1) is within the timing specification. If it is not, the test is stopped and a corresponding report is made in a block 766.

Next, a DUT voltage measurement is made in a block 768. Generally, this measurement is made to verify that all of the main power rails (5 VSB, 5V, 3.3V and 12V) are within the voltage margin specified by the initialization file. As determined in a decision block 770 at the top of FIG. 7f, if any of the power values are outside of the voltage margin (i.e., too high or too low), the test is stopped and a corresponding voltage measure failure report is made in a block 772.

In a block 773 the system boots, and POST (Power On Self Test) codes begin to be reported in a block 774. In one embodiment, the DUT boots into a Microsoft Windows operating system, such as Windows 2000. Accordingly, Windows tests based on a Windows-based Modular Test Architecture (winMTA) are executed in block 776, governed by the WinMTA test executive. WinMTA is a test executive software that controls the individual test modules to be run on the DUT. Test modules are developed separately and the WinMTA software executes them and reports the results to UHC. In accordance with a block 778 and decision block 780 and 782, the UHC software monitors for a DUT message, and determines if such is received within a predefined timeout period. If the DUT message is not received prior to completion of the timeout period, the test is stopped and a test timeout result together with the POST code information is reported in a block 784. The DUT will send all test results to the UHC.

Once the UHC software receives a TEST ENDED message (MID_TEST_ENDED) from the DUT, it will start monitoring for a DUT_PSON#=1 signal, indicating the DUT has shut down, as depicted by a block 786. This ends reporting of the POST code to the host, as depicted by a block 790. A determination is made in a block 788 to whether the DUT passed or failed the test and corresponding information is recorded. The power supply on control signal (PSON_CTROL) is then turned off in a block 792, a wait period of two seconds is performed, and the 5 VSB signal is turned off in a block 794.

Figure 7H:
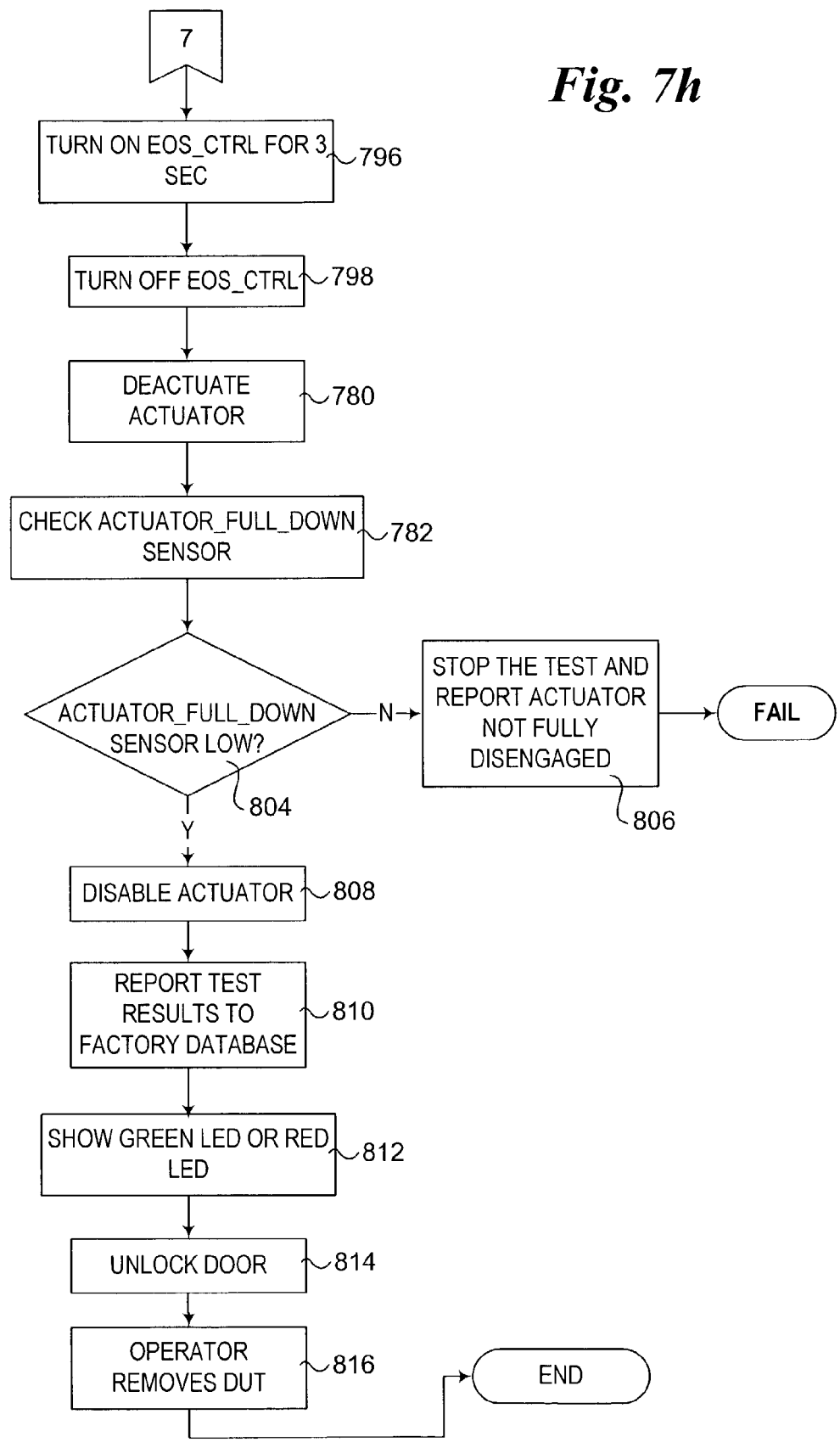

Continuing with blocks 796 and 798 at the top of FIG. 7h, an EOS_CTRL control signal is turned on for two hundred milliseconds and then turned off. In response, all the voltage rails (at this point already turned off) are tied together to ground to ensure that the DUT is totally discharged before being shipped. The actuator is deactuated in a block 800, and the ACTUATOR_FULL_DOWN sensor signal is checked in a block 802. If the ACTUATOR_FULL_DOWN sensor signal indicates that the actuator is not fully-disengaged, the answer to a decision block 804 is No, causing the test to be stopped in a block 806. An actuator not fully disengaged error message is then reported. If the sensor indicates proper actuator disengagement, the actuator is disabled in a block 808, and the test result is reported to the factory database in a block 810. Afterwards, a green or red LED is activated (as appropriate) in a block 812, door 134 is automatically unlocked in a block 814, thereby enabling the operator to remove the DUT in a block 816, completing the test cycle.

Figure 8:
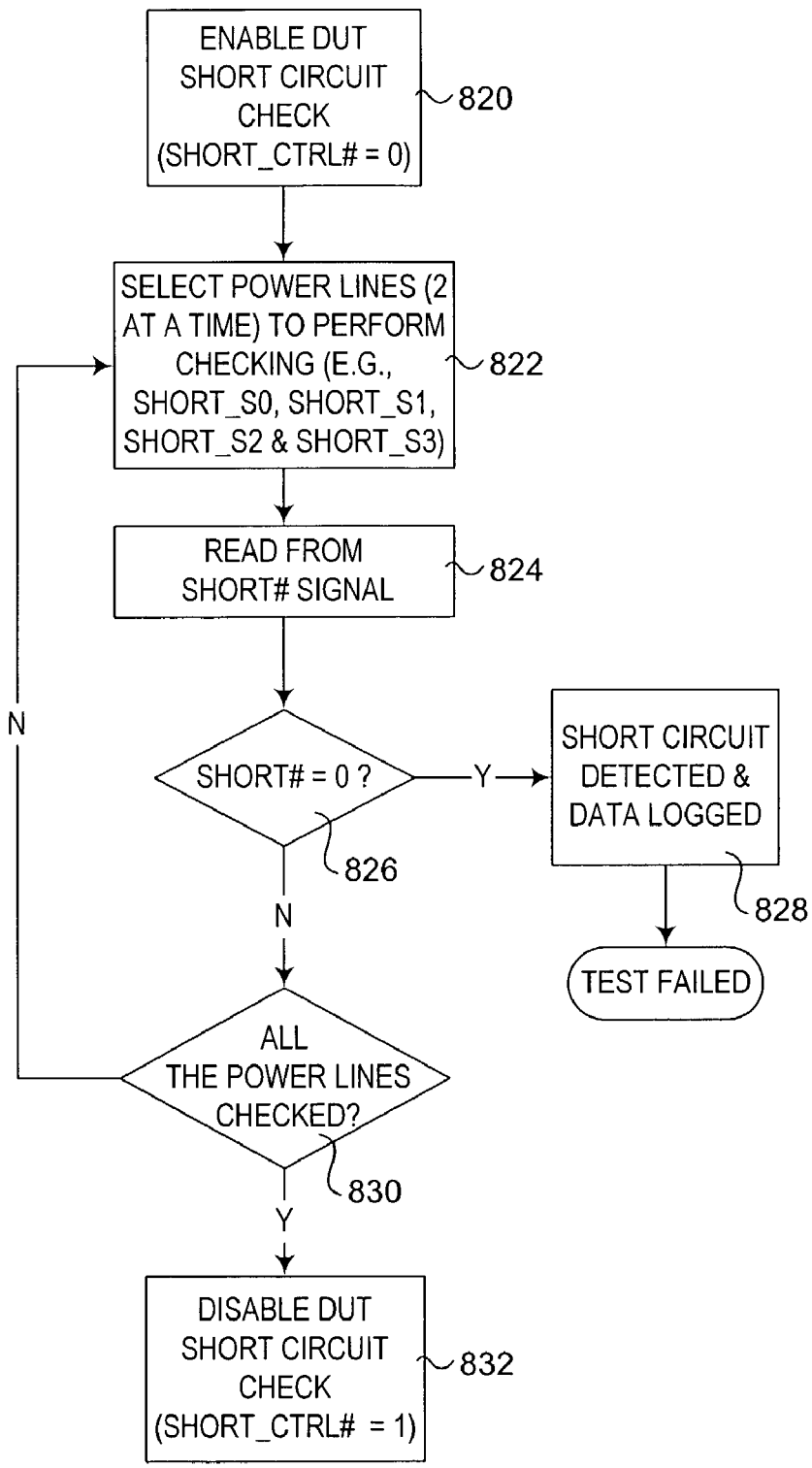
FIG. 8 is a flowchart illustrating operations and logic performed during an automated short circuit test.

Details of various operations performed during the optional short-circuit testing in accordance with an embodiment of the invention are illustrated by the flowchart of FIG. 8. In a block 820, the DUT short circuit check is enabled by setting a SHORT_CTRL# signal to 0). Next, in a block 822, two power lines are selected at a time (i.e., a power line and a common line), and a corresponding short circuit test is performed. In one embodiment, the power lines to check include 12V, 5V, 5 VSB, and 3.3V. In a block 824, the SHORT# signal is read to determine whether a short circuit is indicated. If the SHORT#=0, a short circuit is detected in accordance with a decision block 826, and corresponding data are logged in a block 828. At a decision block 830 a determination is made to whether all of the power lines have been checked. If not, the logic returns to block 822, and the operations of block 822, 824, 826, and 828 are repeated for the next set of power lines. After all of the power lines have been checked, the DUT short circuit check is disabled in a block 812 by setting the DUT_CTRL#=1.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. An apparatus comprising:
   an automated connector insertion mechanism to automatically insert a plurality of connectors into mating components on a circuit board comprising a device under test (DUT), the connectors being inserted along at least two different insertion axes via actuation of a single actuator; and test electronics, operatively coupled to the DUT via the plurality of connectors, having a communications interface to receive test control commands and to perform automated testing of the DUT in response thereto.

2. The apparatus of claim 1, further comprising a host computer, linked in communication with the test electronics via the communications interface, to execute software to control automated testing of the DUT via issuance of test control commands to the test electronics.

3. The apparatus of claim 2, further comprising a scanner, linked in communication with the computer.

4. The apparatus of claim 1, further comprising a frame in which each of the automated connector insertion mechanism and test electronics are housed.

5. The apparatus of claim 1, wherein the test electronics includes a universal power supply to supply at least one programmable input power signal to the DUT.

6. The apparatus of claim 1, further comprising a plurality of probes operatively coupled to the automated connector insertion mechanism tat may be used to automatically couple the test electronics to circuit elements on the DUT during the automated testing.

7. The apparatus of claim 1, wherein the test electronics includes a digital video monitoring unit to automatically test a video signal produced by the DUT during the automated testing.

8. The apparatus of claim 1, wherein the automated connector insertion mechanism may be employed to automatically insert memory devices into one or more corresponding connectors on the DUT.

9. The apparatus of claim 1, wherein the automated connector insertion mechanism may be employed to automatically insert a microprocessor into a corresponding connector on the DUT.

10. The apparatus of claim 1, wherein the automated connector insertion mechanism may be used to employ a plurality of replaceable probe/connector plates each having a plurality of probes and/or connector halves configured for a particular type of DUT.

11. The apparatus of claim 10, further comprising a replaceable probe/connector plate having a peripheral card extender that is operatively coupled to an expansion bus slot on the DUT during testing, said peripheral card extender enabling a peripheral card to be tested with the DUT.

12. The apparatus of claim 1, wherein the at least two different insertion axes are orthogonal to one another.

13. The apparatus of claim 12, wherein the automated connector insertion mechanism may be employed to insert a plurality of connectors along four different insertion axes.

14. The apparatus of claim 1, wherein the automated connector insertion mechanism provides a connection interface to a computer system board having an ATX form-factor.

15. The apparatus of claim 1, wherein the automated connector insertion mechanism includes a Reconfigurable carrier plate to which a DOT is attached during testing.

16. A system comprising:

a plurality of test stations, each including:

an automated connector insertion mechanism to automatically insert a plurality of connectors into mating components on a respective circuit board comprising a device under test (DUT), the connectors being inserted along at least two different insertion axes via actuation of a single actuator; and test electronics, operatively coupled to the DUT via the plurality of connectors, having a communications interface to receive test control commands and to perform automated testing of the DUT in response thereto; and at least one host computer, linked in communication with the test control electronics of the plurality of test stations via their respective communications interfaces, to execute software to control automated testing of a plurality of DUT's via issuance of test control commands to the test control electronics of the plurality of test stations.

17. The system of claim 16, further comprising data logging means for storing results of the automated DUT testing.

18. The system of claim 17, wherein the data logging means comprises a database hosted by a database server that is linked in communication with said at least one host computer.

19. The system of claim 16, wherein the DUT comprises a computer system board.

20. The system of claim 19, wherein the computer system board has an ATX form factor.

* * * * *

UNITED STATES PATENT AND TRADEMARK OFFICE
CERTIFICATE OF CORRECTION

PATENT NO. : 7,154,257 B2 Page 1 of 1
APPLICATION NO. : 10/261055
DATED : December 26, 2006
INVENTOR(S) : Le et al.

It is certified that error appears in the above-identified patent and that said Letters Patent is hereby corrected as shown below:

In column 13, at line 23, delete "tat" and insert --that--.
In column 14, at line 12, delete "Reconfigurable" and insert --reconfigurable--.
In column 14, at line 13, delete "DOT" and insert --DUT--.

Signed and Sealed this

Twenty-seventh Day of November, 2007

JON W. DUDAS
*Director of the United States Patent and Trademark Office*